(12) United States Patent
Frischmuth et al.

(10) Patent No.: US 10,710,874 B2
(45) Date of Patent: Jul. 14, 2020

(54) MICROMECHANICAL STRUCTURE AND METHOD FOR MANUFACTURING THE SAME

(71) Applicant: Infineon Technologies AG, Neubiberg (DE)

(72) Inventors: Tobias Frischmuth, Vienna (AT); Guenter Denifl, Annenheim (AT); Thomas Grille, Villach (AT); Ursula Hedenig, Villach (AT); Markus Kahn, Rangersdorf (AT); Daniel Maurer, Feld am See (AT); Ulrich Schmid, Vienna (AT); Michael Schneider, Vienna (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 112 days.

(21) Appl. No.: 15/636,702

(22) Filed: Jun. 29, 2017

(65) Prior Publication Data
US 2018/0002167 A1    Jan. 4, 2018

(30) Foreign Application Priority Data
Jun. 29, 2016 (DE) .......................... 10 2016 111 909

(51) Int. Cl.
*H04R 19/00* (2006.01)
*B81C 1/00* (2006.01)
(Continued)

(52) U.S. Cl.
CPC .......... *B81C 1/00658* (2013.01); *B81B 3/007* (2013.01); *G01L 1/00* (2013.01);
(Continued)

(58) Field of Classification Search
CPC ............ H04R 19/005; H04R 2201/003; B81C 1/00134; B81C 1/00158; B81C 1/00206
See application file for complete search history.

(56) References Cited

U.S. PATENT DOCUMENTS

| | | | | |
|---|---|---|---|---|
| 5,110,373 A | * | 5/1992 | Mauger | B81C 1/00666 148/33.2 |
| 5,576,483 A | * | 11/1996 | Bonin | B82Y 35/00 361/283.2 |

(Continued)

FOREIGN PATENT DOCUMENTS

| | | |
|---|---|---|
| CN | 104902400 A | 9/2015 |
| CN | 105314587 A | 2/2016 |

(Continued)

OTHER PUBLICATIONS

Properties of Parylene [online]. PCT Para-Coat Technologies [retrieved on Dec. 11, 2018]. Retrieved from the Internet: <URL: http://pctconformalcoating.com/wp-content/uploads/2017/01/Properties-of-PCT-Parylene-TDS.pdf> (Year: 2017).*

(Continued)

*Primary Examiner* — Fan S Tsang
*Assistant Examiner* — Ryan Robinson
(74) *Attorney, Agent, or Firm* — Viering, Jentschura & Partner MBB

(57) ABSTRACT

A micromechanical structure in accordance with various embodiments may include: a substrate; and a functional structure arranged at the substrate; wherein the functional structure includes a functional region which is deflectable with respect to the substrate responsive to a force acting on the functional region; and wherein at least a section of the functional region has an elastic modulus in the range from about 5 GPa to about 70 GPa.

21 Claims, 18 Drawing Sheets

(51) Int. Cl.

| | |
|---|---|
| *G01Q 70/14* | (2010.01) |
| *H04R 7/26* | (2006.01) |
| *G01L 7/08* | (2006.01) |
| *G01L 1/00* | (2006.01) |
| *B81B 3/00* | (2006.01) |
| *G01Q 60/24* | (2010.01) |
| *H04R 19/02* | (2006.01) |
| *H04R 7/10* | (2006.01) |
| *H04R 19/04* | (2006.01) |

(52) U.S. Cl.
CPC ............... *G01L 1/005* (2013.01); *G01L 7/08* (2013.01); *G01Q 60/24* (2013.01); *G01Q 70/14* (2013.01); *H04R 7/26* (2013.01); *H04R 19/02* (2013.01); *B81B 2201/0257* (2013.01); *B81B 2201/0264* (2013.01); *B81B 2201/12* (2013.01); *B81B 2203/0118* (2013.01); *B81B 2203/0127* (2013.01); *B81C 2201/0166* (2013.01); *H04R 7/10* (2013.01); *H04R 19/005* (2013.01); *H04R 19/04* (2013.01); *H04R 2201/003* (2013.01)

(56) References Cited

U.S. PATENT DOCUMENTS

| | | | | |
|---|---|---|---|---|
| 6,392,233 | B1* | 5/2002 | Channin | G01J 5/40 |
| | | | | 250/234 |
| 7,141,915 | B2* | 11/2006 | Takeuchi | B81B 3/0018 |
| | | | | 310/328 |
| 7,256,670 | B2* | 8/2007 | Jahnes | H01H 59/0009 |
| | | | | 335/78 |
| 8,363,864 | B2* | 1/2013 | Chung | H04R 17/005 |
| | | | | 29/25.35 |
| 8,409,900 | B2* | 4/2013 | Huffman | B81C 1/00182 |
| | | | | 257/E21.002 |
| 8,529,021 | B2* | 9/2013 | Baumer | B41J 2/03 |
| | | | | 347/54 |
| 8,733,176 | B2* | 5/2014 | Li | B81B 3/0086 |
| | | | | 73/715 |
| 8,760,031 | B2* | 6/2014 | Chang | B06B 1/0292 |
| | | | | 310/300 |
| 9,212,045 | B1 | 12/2015 | Schmid et al. | |
| 9,731,957 | B2* | 8/2017 | Sachin | B81B 3/0021 |
| 2003/0119220 | A1 | 6/2003 | Mlcak et al. | |
| 2006/0017533 | A1 | 1/2006 | Jahnes et al. | |
| 2007/0121972 | A1* | 5/2007 | Suzuki | B81B 3/0072 |
| | | | | 381/174 |
| 2011/0073859 | A1 | 3/2011 | Chen et al. | |
| 2014/0294218 | A1* | 10/2014 | Suvanto | H04M 1/03 |
| | | | | 381/337 |
| 2015/0256913 | A1 | 9/2015 | Dehe | |
| 2016/0031701 | A1* | 2/2016 | Schmid | B81C 1/00142 |
| | | | | 310/300 |
| 2018/0005659 | A1* | 1/2018 | Itaya | G11B 5/84 |
| 2018/0035228 | A1* | 2/2018 | Boyd | B81B 3/0021 |

FOREIGN PATENT DOCUMENTS

| | | |
|---|---|---|
| CN | 105314590 A | 2/2016 |
| DE | 102015213756 A1 | 2/2016 |
| DE | 102015213757 A1 | 2/2016 |
| KR | 10-2016-0016674 A | 2/2016 |
| WO | 0172104 A1 | 10/2001 |

OTHER PUBLICATIONS

Fraga et al., "Applications of SiC-Based Thin Films in Electronic and MEMS Devices", Intech pp. 313-336, Oct. 2012 (Year: 2012).*
Rehder et al., "PECVD a-Sic:H Young's modulus obtained by MEMS resonant frequency", Feb. 20, 2008, Journal of Non-Crystalline Solids 354(19):2359-2364 (Year: 2008).*
M.N.P.Carreño et al. , "Self-sustained bridges of a-SiC:H films obtained by PECVD at low temperatures for MEMS applications", Journal of Non-Crystalline Solids, vol. 338-340, pp. 490-495, 2004.
Gwiy-sang Chung, "Characteristics of poly 3C-SiC micro resonators with doping concentrations", Journal of Korean Sensor Society, vol. 18, No. 3, pp. 207-209,2009 (with English Abstract).
G. Rehder et al., "PECVD a-Sic: H Young's modulus obtained by MEMS resonant frequency", Journal of non-crystalline solids, Feb. 20, 2008, pp. 2359-2364, 354, Elsevier B.V.
M.A. El Khakani et al., "Hardness and Young's modulus of amorphous α-SiC thin films determined by nanoindentation and bulge tests", Jan. 1994, vol. 9, No. 1, Material Research Society.
Steven Young, et al. "A novel low-temperature method to fabricate MEMS resonators using PMGI as a sacrificial layer", Journal of Micromechanics and Microengineering, 2005, pp. 1824-1830, 15, Institute of Physics Publishing Ltd., UK.
Sean W. King et al. "Rigidity Percolation in Plasma Enhanced Chemical Vapor Deposited a-SiC:H Thin Films" , ECS Transactions, 2010, pp. 185-194, vol. 33, Issue 8, he Electrochemical Society.
G. Genolet et al., "Soft, entirely photoplastic probes for scanning force microscopy", Review of Scientific Instruments, May 1999, vol. 70, No. 5, American Institute of Physics.
Yusuke Matsuda, et al., "Tunable Plasticity in Amorphous Silicon Carbide Films", Applied materials & interfaces, Research Article, 2013, pp. 7950-7955, 5, American Chemical Society.
N. Frangis et al., "The formation of 3C-SiC in crystalline Si by carbon implantation at 950° C and annealing—a structural study", Journal of Crystal Growth, 1997, pp. 218-228, 181, Elsevier Science B.V.
Chinese Office Action based on 201710514304 Jun. 29, 2017, dated Nov. 29, 2018, 8 pages (for reference purpose only).

* cited by examiner

MICROMECHANICAL STRUCTURE AND METHOD FOR MANUFACTURING THE SAME

CROSS-REFERENCE TO RELATED APPLICATION

This application claims priority to German Patent Application Serial No. 10 2016 111 909.1, which was filed Jun. 29, 2016, and is incorporated herein by reference in its entirety.

TECHNICAL FIELD

Various embodiments relate generally to a micromechanical structure and a method for manufacturing the same.

BACKGROUND

The term micro electromechanical system (MEMS) or micro mechanical system/structure is often used to refer to small integrated devices or systems that combine electrical and mechanical components. When focusing on the micro mechanical parts, the term "micro mechanical system" may be used to describe small integrated devices or systems which include one or more micro mechanical elements and possibly, but not necessarily, electrical components and/or electronic components.

Micro mechanical systems may be used as, for example, actuators, transducers or sensors. Micro mechanical systems or structures (MMS) may include deflectable structures such as membranes. A micro electromechanical structure (MEMS) may include one or more micromechanical structures whose deflectable structure may be deflected electrically (actuator). Alternatively or in addition, the MEMS may provide an electrical signal responsive to a deflection of the deflectable structure of the MMS (sensor).

Movable microstructures such as, for example, membranes for micro transducers (e.g., microphones or micro loudspeakers) or cantilevers for atomic force microscopes (AFM) may require, particularly at their suspension points or areas or at areas that are important for the functionality of the structures, materials that allow to modify both the static bending characteristics/deflection behavior and the dynamic behavior under resonance conditions depending on the specific application.

Very soft AFM cantilevers (for example, made of a polymer) may result in a low resonant frequency, which in turn reduces the maximum scanning speed and sampling rate. For example, in the field of mechanically sensitive samples, e.g., for a measurement of organic substances like organic cells, very soft AFM cantilevers may reduce the risk to damage the samples. Furthermore, a laser may not be used in a liquid for readout of the oscillation/bending, but a sensor element (mostly a piezo resistive strain sensor) that is integrated on the cantilever beam may be required. In case of very soft materials, though, this may have the effect that due to the extreme softness of the base material, extension and compression of the base material that may be transferred onto the cantilever beam, is only detected to a very limited amount due to the high mechanical stiffness of the sensing material (e.g. in case of a strain sensor).

Soft polymers such as, for example, SU8 may furthermore have a limited stability under environmental conditions. For example, they may exhibit high shrinkage during manufacturing, water intake during operation, and/or aging phenomena. Furthermore, they may have a very high coefficient of thermal expansion (CTE) compared to standard semiconductor materials (e.g., SU8 has a CTE of about 52 ppm/° C. compared to Si having a CTE of about 2.56 ppm/° C.), and there may be only few possibilities to influence their elastic properties (e.g., the elastic modulus of SU8 is about 2 GPa).

SUMMARY

A micromechanical structure according to various embodiments may include: a substrate; and a functional structure arranged at the substrate; wherein the functional structure includes a functional region which is deflectable with respect to the substrate responsive to a force acting on the functional region; and wherein at least a section of the functional region has an elastic modulus in the range from about 5 GPa to about 70 GPa.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
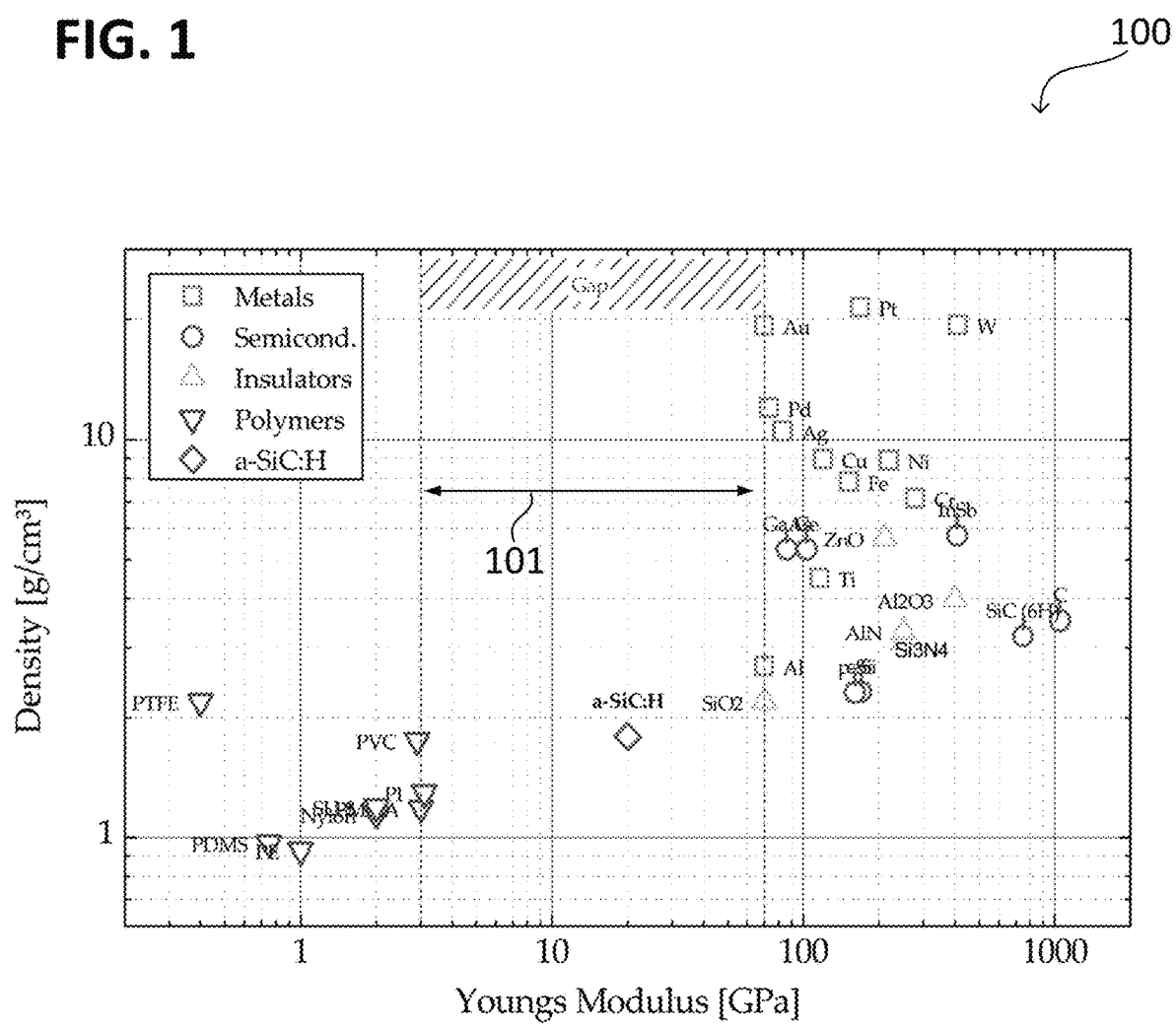
FIG. 1 shows a diagram illustrating density and elastic modulus (Young's modulus) of various materials.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regard to a deposited material formed "over" a side or surface may be used herein to mean that the deposited material may be formed "directly on", e.g., in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "lateral" used with regard to the "lateral" extension of a structure or element (e.g. of a wafer, a substrate, a carrier, a region, a layer) or "laterally" next to, may be used herein to mean an extension or a positional relationship along a surface of the structure or element. That means that a surface of a substrate (e.g., a surface of a carrier, a surface of a wafer, a surface of a support) may serve as reference, commonly referred to as the main processing surface of the substrate (or the main processing surface of the carrier or wafer or support). Further, the term "width" used with regard to a "width" of a structure, element or region may be used herein to mean the lateral extension of the structure, element or region. Further, the term "height" used with regard to a height of a structure, element or region, may be used herein to mean an extension of the structure along a direction perpendicular to the surface of a substrate (e.g., perpendicular to the main processing surface of a substrate). The term "thickness" used with regard to a "thickness" of a layer may be used herein to mean the spatial extension of the layer perpendicular to the surface of the support (the material) on which the layer is deposited. If the surface of the support is parallel to the surface of the substrate (e.g., to the main processing surface) the "thickness" of the layer deposited on the support may be the same as the height of the layer. Furthermore, a "vertical" structure may be referred to as a structure extending in a direction perpendicular to the lateral direction (e.g., perpendicular to the main processing surface of a substrate) and a "vertical" extension may be referred to as an extension along a direction perpendicular to the lateral direction (e.g., an extension perpendicular to the main processing surface of a substrate).

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

Micro electro mechanical systems (MEMS) may include micro mechanical systems (MMS) which may be used as actuators to deflect components thereof, for example to actuate other components. Other MMS systems may be used as a sensor and be configured to sense a mechanical deflection of parts thereof. Thus, MMS-sensors and/or actuators may include components such as one or more membranes and/or one or more cantilevers.

Sound transducers may be realized as micro electromechanical structure (MEMS). One type of sound transducer may be a microphone that is configured to sense variations of sound pressure levels and/or a force generated by the variations and to provide an electrical signal representing the sensed variations. The sound pressure variations may be sensed by deflecting a membrane structure that is arranged such that an electrical field is modified by a deflection of the membrane structure, the modification measurable, for example, as variations of an electrical voltage and/or as variation in an electrical impedance of the MEMS. Another type of sound transducer may be a loudspeaker configured to generate variations of the sound pressure level responsive to a deflection of the membrane structure. The deflection may be inducted by an electrical signal generating a force, e.g., by means of an electric field. A sound transducer may be configured to operate as a microphone and/or as a loudspeaker. A MEMS sound transducer may be configured to operate as a micro-speaker and/or a microphone.

Usually, microphones and/or micro-speakers realized as MEMS are manufactured in silicon technology. Silicon micro-machined microphones may, for example, include or be formed from a capacitive transducer including a flexible membrane moving in the sound field and a static perforated electrode, which is called back plate. Alternatively, a piezoelectric element may be actuated in a microphone or used as an actuator in a microspeaker.

In general, the functional region of the micromechanical structure may be driven or sensed by a circuit element. The functional region and the circuit element may be coupled with each other, e.g. by an electrical force (e.g. capacitively). Alternatively or additionally, the functional region and the circuit element may be coupled piezoelectrically or resistively. For example, the circuit element may include or may be formed from an electrode or a piezoelectric transducer.

The complementary transducer is a micro-speaker that needs to be actuated such that a large stroke displacement is achieved, for example by a capacitive actuation, to drive a large air displacement and hence acceptable sound pressure.

A deflectable component of a micromechanical structure such as a membrane of a sound transducer may be clamped, i.e., fixed, at a fixed (clamped) portion and vibratable or deflectable at a deflectable portion.

An aspect of various embodiments is to enable optimization or at least substantial improvement of movable (e.g., deflectable, e.g., bendable, e.g., flexible, e.g. vibratable) microstructures (such as, for example, membranes for micro transducers (e.g., microphones or micro loudspeakers) or cantilevers, e.g., for atomic force microscopes (AFM)) by use of soft materials and/or soft sections or regions in the microstructure, e.g. in a functional region of the microstructure, e.g. at a clamping area or suspension area of the microstructure in some embodiments.

In accordance with various embodiments, the term "soft" as used herein in expressions such as "soft material", "soft section", "soft region", etc., may include or refer to a material (e.g., the base material having impurities), a section (e.g., the at least a section of the functional region), a region (e.g., the functional region), etc., that has an elastic modulus of less than about 70 GPa (Gigapascal), e.g. in the range from about 5 GPa to about 70 GPa, e.g. in the range from about 5 GPa to about 60 GPa, e.g. in the range from about 10 GPa to about 60 GPa, e.g. in the range from about 10 GPa to about 50 GPa, e.g. in the range from about 10 GPa to about 40 GPa, e.g. in the range from about 10 GPa to about 30 GPa, e.g. in the range from about 15 GPa to about 25 GPa, e.g. about 20 GPa.

In accordance with various embodiments, the term "soft" as used herein in expressions such as "soft material", "soft section", "soft region", etc., may include or refer to a material (e.g., the base material having impurities), section (e.g., the at least a section of the functional region), region (e.g., the functional region), etc., that has a hardness of less than about 20 GPa (Gigapascal), e.g. in the range from about 1 GPa to about 20 GPa, e.g. in the range from about 1 GPa to about 15 GPa, e.g. in the range from about 1 GPa to about 10 GPa, e.g. in the range from about 1 GPa to about 5 GPa.

An aspect of various embodiments is to modify (e.g., locally) mechanical properties, e.g. bending properties, e.g. deflecting properties, of a movable microstructure.

An aspect of various embodiments is to provide a movable microstructure having a laterally modified hardness, elasticity and/or stiffness. For example, a hardness, elasticity and/or stiffness of a base material used for a functional region of the movable microstructure may laterally vary. For example, a thickness of the microstructure's functional region may laterally vary (having a lateral gradient) so as to obtain a lateral variation in the microstructure's hardness, elasticity and/or stiffness in the functional region. For example, a microstructure may be provided having a smaller thickness at its edge (e.g., a membrane or cantilever having a smaller thickness at its suspension or clamping point or area). For example, a material composition of the microstructure's functional region may laterally vary so as to obtain a lateral variation in the microstructure's hardness, elasticity and/or stiffness in the functional region (e.g., a locally reduced hardness or stiffness at, e.g., a suspension or clamping point or area of a membrane or cantilever). For example, a recess in a base material of the microstructure may be filled with a material that is softer compared to the base material so as to obtain a lateral variation in the microstructure's hardness, elasticity and/or stiffness in the functional region (e.g., a locally reduced hardness, elasticity and/or stiffness at, e.g., a suspension or clamping point or area of a membrane or cantilever). The clamping point or area may refer to the portion, which is in physical contact to a suspension region or to the substrate.

According to various embodiments, the stiffness (e.g., of a cantilever) may be understood as bending stiffness. The bending stiffness may refer to the resistance of a member against bending deformation. The bending stiffness may be defined as applied force divided by deflection. More generally, the stiffness may be understood as fraction applied force divided by displacement (e.g., at the point of the applying the force).

An aspect of various embodiments is to form at least a portion of a movable microstructure (e.g. at least a section of a functional region of the microstructure, e.g. at least a section of a membrane or cantilever) from a base material that is a soft material as described above. In some embodiments, the soft material may be formed by a deposition process, e.g. a vapor deposition process, e.g. a chemical vapor deposition (CVD) process (e.g., a plasma enhanced chemical vapor deposition (PECVD) process) or a physical vapor deposition (PVD) process (e.g. a sputter deposition process).

An aspect of various embodiments is to locally modify a base material (e.g., a silicon material, e.g. polysilicon) of a movable microstructure subsequent to its formation, e.g. to soften the base material in the at least a section. In some embodiments, this modification may be achieved by means of implanting impurities into the base material, e.g. followed by an annealing. In some embodiments, the elastic modulus (also referred to as Young's modulus) of a microstructure may be locally reduced in the microstructure, e.g. in a functional region of the microstructure, e.g. in a membrane or cantilever of the microstructure, e.g. at a suspension or clamping point or area of a membrane or cantilever.

According to various embodiments, the base material, the impurities and/or their chemical combination may be inorganic and/or a non-polymeric material. Alternatively or additionally, the base material may include or be formed from a semiconductor material, e.g., an amorphous semiconductor material and/or a hydrogenated semiconductor material, and/or a metallic material.

The micromechanical structure and method for manufacturing the same may provide a cantilever (e.g., for atomic force microscopy), which combines a higher maximum scanning speed (and sampling rate) and a minimized risk of damaging mechanical sensitive samples, e.g., for a measurement of organic substances like organic cells.

FIG. 1 shows diagram 100 illustrating density and elastic moduli (Young's moduli) of various materials, in particular various metals, insulators, and polymers, and of a hydrogenated amorphous silicon carbide (a-SiC:H) material. Polymers usually have elastic moduli in the range from about 0.1 GPa to about 2 GPa and densities of mostly less than about 2 g/cm$^3$. On the other hand, metals, semiconductors and insulators usually have an elastic modulus in the range from about 70 GPa to about 300 GPa, and densities up to more than about 20 g/cm$^3$ (in case of metals).

Only few materials may be available that have an elastic modulus in the range 101 from about 3 GPa to about 70 GPa and/or a density of more than about 20 g/cm$^3$, as may be seen from diagram 100 ("gap").

An aspect of various embodiments is to provide materials for micromechanical structures that may function as a bridge (in other words, fill the gap 101) between extremely soft polymers (e.g., SU8) on the one side, and metals (mostly having relatively high densities) and relatively stiff semiconductors up to extremely stiff materials such as crystalline SiC or diamond on the other side.

On the other hand, an aspect of various embodiments may be seen in the realization that materials having an elastic modulus in the range from about 20 GPa to about 70 GPa (e.g. in the range from about 20 GPa to about 50 Pa, e.g. in the range from about 20 GPa to about 30 GPa) and alternatively, materials having a high density (e.g., greater than about 20 g/cm$^3$) and a low elastic modulus (e.g., less than about 20 GPa, e.g. less than about 10 GPa, e.g. less than about 5 GPa, e.g. less than about 3 GPa) may be particularly interesting for applications based on movable microstructures such as cantilevers or membranes.

Various embodiments therefore provide applications of the aforementioned materials. In addition, various embodiments provide methods to manufacture the aforementioned materials.

Up to now, polymers have been used for the manufacturing of soft cantilevers. In this case, optical methods (using laser beams) are mainly suited for readout of the cantilever oscillations because strain (extension and/or compression) of the cantilever base material is transferred only to a very much reduced degree onto bending sensors (such as piezo resistive strain gauges) located on the cantilever due to the extreme softness of the cantilever base material. Thus, the strain sensitive elements may strongly dominate the overall deflection of the cantilever due to their enhanced mechanical stiffness. Soft cantilevers are actually needed for measuring or detecting organic substances, or in liquids where optical readout is difficult to achieve. Moreover, stability of polymers against environmental conditions is only limited. For example, polymers may exhibit one or more of the following effects: evaporation, intake of water from the environment, limited stability against harsh conditions, aging effects. Furthermore, polymers have a very high coefficient of thermal expansion (CTE) compared to commonly used semiconductor materials (e.g., SU8 having a CTE of about 52 ppm/° C. compared to Si having a CTE of about 2.56 ppm/° C.), and there are only few possibilities to modify their elastic properties (elastic modulus of SU8 is about 2 GPa). Therefore, up to now polymer cantilevers are used in combination with bending sensors, even though this results in a less favorable signal to noise ratio (SNR).

Conventional membranes (e.g., for micro transducers, e.g. microphones or loudspeakers) may use a "spring" effect that may be achieved by means of corrugations in suspension regions of the membranes. This effect may increase the extensibility of the membrane. These corrugations, i.e. lateral modifications of the membranes, may require a relatively high fabrication effort.

Various embodiments may achieve a "softening" of defined regions of a microstructure (micromechanical structure), e.g. of a membrane or cantilever. This may improve or optimize extension characteristics of the microstructure, without the need for lateral modifications such as the aforementioned corrugations. This may reduce the fabrication effort of the microstructures. Alternatively or in addition, this may lead to an increase in precision of the microstructures.

An aspect of various embodiments is to provide soft materials (e.g., materials that fill the above-mentioned material gap 101) by means of suitable methods. An aspect of various embodiments is to use materials, which have been made softer by means of a subsequent modification (also referred to as "modification step", e.g., by means of introducing of base materials or by means of implantation), in micromechanical structures, e.g. in MEMS (micro electromechanical system) components. In some embodiments, properties of the materials may be further improved or optimized by means of an additional/subsequent annealing process or step (e.g., in or after the modification step). In some embodiments, the soft (or softened) material or materials may be used in an entire area or region of a microstructure (e.g., membrane or cantilever). In some embodiments, the soft (or softened) material or materials by used in a functional region of the microstructure. In some embodiments, the soft (or softened) material or materials may be used locally in an area or region of a microstructure that may, for example, be critical for optimization of bending characteristics of the microstructure. In some embodiments, the soft (or softened) material or materials may be used in a suspension area or region of the microstructure (e.g., membrane or cantilever).

In accordance with various embodiments, extension and/or bending characteristics of movable microstructures (e.g., membranes or cantilevers) may be enhanced or optimized with significantly lower fabrication effort compared to conventional solutions.

An aspect of various embodiments is to apply soft compound materials or compound materials, which have been softened (made softer) by subsequent modification (modification step), made of two or more elements to improve or optimize properties of movable microstructures (e.g., membranes, cantilevers, or the like).

Various embodiments provide manufacturing methods for soft movable microstructures.

Various embodiments provide methods for producing a compound material that may, for example, be used in a movable microstructure, e.g. in a membrane or cantilever structure.

In accordance with various embodiments, the compound material may be produced by means of processes used in micro system technology, e.g. by means of a deposition process, e.g. a vapor deposition process, e.g. a chemical vapor deposition (CVD) process (e.g. a plasma enhanced chemical vapor deposition (PECVD) process), or a physical vapor deposition (PVD) process. This may allow for a large variation of the deposition conditions or parameters (e.g., temperature, (partial) pressure, gas flux, etc.). This may, for example, allow for adjusting or fine-tuning of material properties. For example, by use of suitable deposition processes and/or processing conditions, comparatively soft materials may be obtained.

In accordance with some embodiments, the compound material may include or may be hydrogenated amorphous silicon carbide (a-SiC:H).

Figure 2:
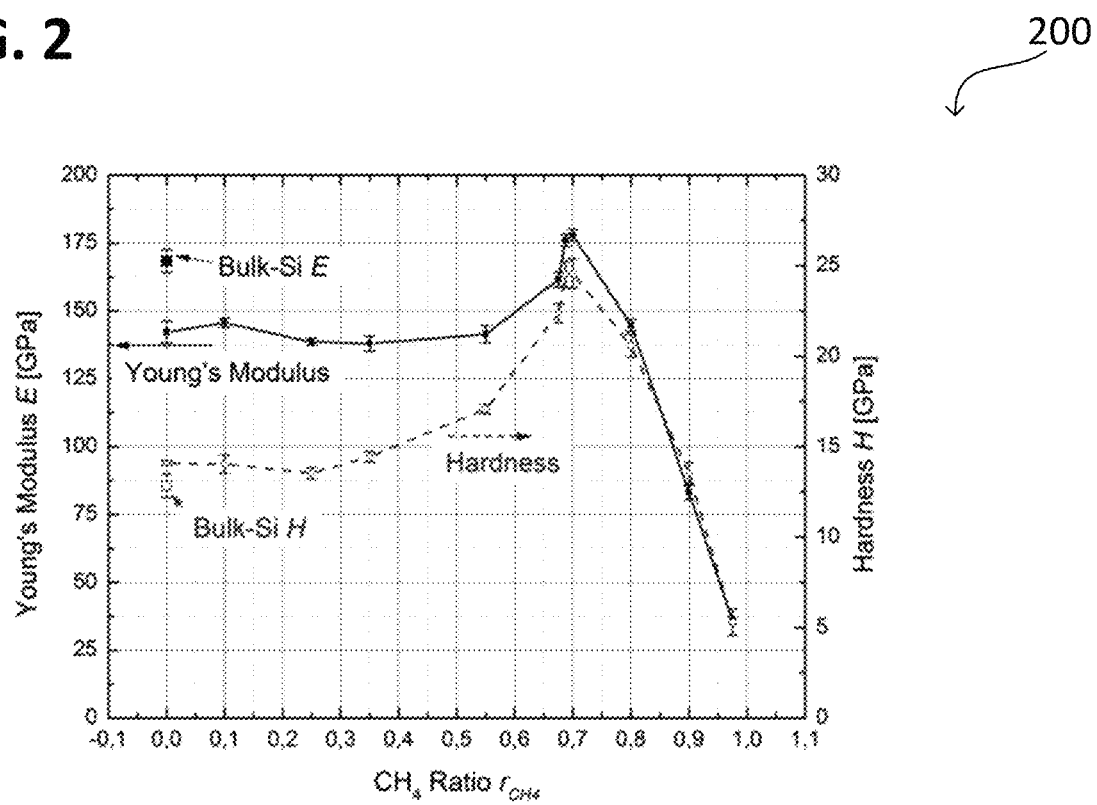
FIG. 2 shows a diagram illustrating the influence of the amount of carbon on the resulting elastic modulus and hardness.

FIG. 2 shows diagram 200 illustrating the influence of the amount of carbon on the resulting elastic modulus and hardness of amorphous hydrogen rich silicon carbide (a-SiC:H) that was deposited by PECVD. In one or more alternative embodiments, other polyatomic nonmetals may be used for doping such as phosphorous.

Upon application of suitable deposition conditions (e.g., a high carbon content in the case illustrated in FIG. 2) a material combination with very low elastic modulus, e.g. in the range from about 25 GPa to about 100 GPa in accordance with some embodiments, may be obtained, which may be beneficial for the desired applications. Nonetheless, compared to SU8 as a benchmark, layers obtained under the aforementioned deposition conditions may be aging and temperature resistant up to temperatures of about 400° C. and may have a coefficient of thermal expansion (CTE), which may be significantly closer to the CTE of silicon, which is about 2.56 ppm/° C. For example, silicon carbide (SiC) may have a CTE of about 2.77 ppm/° C., which is close to the CTE of silicon. In comparison, aluminum has a CTE of about 23.1 ppm/° C., and SU8 has a CTE of about 52 ppm/° C.

Thus, the mechanical properties of the deposited layer or material (e.g., elastic modulus, hardness and/or stiffness) may be influenced by the Si/C composition in the layer or material. Alternatively, or in addition, the properties of the deposited layer or material (e.g., e.g., elastic modulus, hardness and/or stiffness) may be influenced by the hydrogen content in the layer or material. The hydrogen content of the deposited layer or material may, for example, be adjusted by means of reactive adding of $H_2$ in the deposition process.

According to various embodiments, the hardness (also referred to as mechanical hardness) may be understood in accordance with a Vickers hardness scale (DIN EN ISO 6507-1). The Vickers hardness may be given in International System of Units in Gigapascal (GPa) or a corresponding unit on a non-dimensional scale (also referred to as Vickers Pyramid Number (HV) or Diamond Pyramid Hardness (DPH)) which are convertible into each other in accordance with HV=100*GPa (approximately). For example, 5 GPa may correspond to 510 HV or 20 GPa may correspond to 2040 HV.

In accordance with some embodiments, the deposition of metallic compounds may be realized through a PECVD process/system. Alternatively, a MOCVD (metal organic CVD) process/system may be used, or a PVD process/system.

In accordance with some embodiments, other materials or material combinations may be used, such as, for example, a-C:H ($sp^2$ hybridized), a-SiN:H, amorphous hydrogenated silicon oxide (a-SiO:H), a-SiCO:H, Aluminum (Al), Gallium (Ga), Germanium (Ge), Indium (In), Arsenate (As), Antimony (Sb), Cadmium (Cd), Tellurium (Te), Selenium (Se), Zinc (Zn) or their combination with Silicon (Si), Carbon (C), Nitrogen (N), Oxygen (O), and/or Hydrogen (H).

In accordance with various embodiments, superposition of a plasma component (during PECVD) along the substrate direction by means of a high frequency (RF) field may also enable or contribute to the production of soft materials, as is shown in the following figures.

Figure 3:
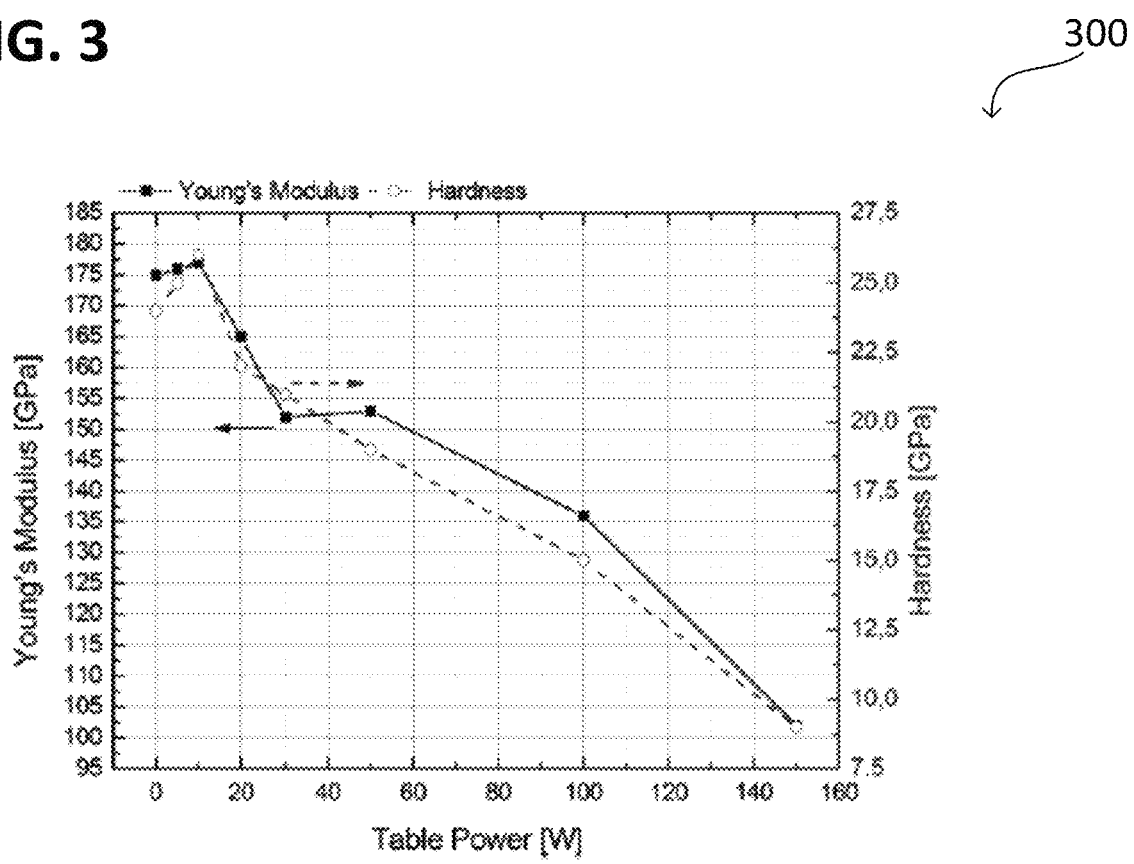
FIG. 3 shows a diagram illustrating the influence of an additional RF field along the substrate direction on the resulting elastic modulus and hardness.

FIG. 3 shows in diagram 300 the influence of an additional RF field along the substrate direction on the resulting elastic modulus and hardness of the deposited material or layer, for the example of an a-SiC:H layer. As may be seen from the figure, a reduction of the elastic modulus by about 40% from about 175 GPa to about 103 GPa may be obtained in the example shown by means of the superposition of the RF field. Without being bound to theory, the softening effect of the plasma component may be attributed to the plasma's capability of breaking lattice bonds (e.g., SiC bonds).

In accordance with some embodiments, the above-described RF field superposition technique may be used in combination with deposition conditions that already result in a low elastic modulus. In this case, the combination of the superposition technique and the deposition conditions may yield even lower values of the elastic modulus, e.g. in the range from about 5 GPa to about 20 GPa. The above-described RF field superposition technique may be used in combination with any of the material combinations mentioned herein.

In accordance with some embodiments, a process gas used in the deposition process may include or may be $CH_4$, $C_2H_2$ $N_2$, and/or hydrogen ($H_2$), or the like. The process gas may be configured to react chemically with the deposited material or layer, e.g., being incorporated into the material or layer (e.g., by forming a compound material like a carbide or nitride). Generally, the process gas may include at least one of: nitrogen, carbon and/or hydrogen.

In accordance with some embodiments, an inert gas like helium (He) may be added in the deposition process. The process gas may be configured to be chemically inert regarding the deposited material or layer, e.g., reacting much less than the process gas.

In accordance with some embodiments, an optional annealing process or step may be applied after the deposition of the layer or material. This may, for example, further optimize layer properties, e.g., by chemical and/or crystallographic reorganization. An annealing temperature in the annealing process or step may, for example, be more than about 300° C. (e.g., more than about 600° C.) and/or be in the range from about 300° C. to about 2000° C., e.g. in the range from about 400° C. to about 1000° C., e.g. about 600° C. An annealing time period in the annealing process or step may, for example, be in the range from about 1 femtosecond to about 10 hours, e.g. in the range from about 1 femtosecond to about 100 femtoseconds (e.g., if annealing is applied via a laser) or e.g. in the range from about 0.5 hours to about 10 hours (e.g., if annealing is applied via a furnace).

In accordance with various embodiments, the mechanical properties of a material or layer may be adjusted (also referred to as "modification step"), e.g., by means of introducing impurities into the material or layer. Impurities may for example be introduced by a doping process (e.g., an implantation process) and/or by a diffusion process, e.g., after the deposition. An optional additional annealing process or step (e.g., at the annealing temperature, e.g., at a temperature of greater than or equal to 600° C.) may allow for further improvement or optimization of the mechanical (and electrical) properties, e.g., by chemical and/or crystallographic reorganization (like healing implantation defects).

Figure 4:
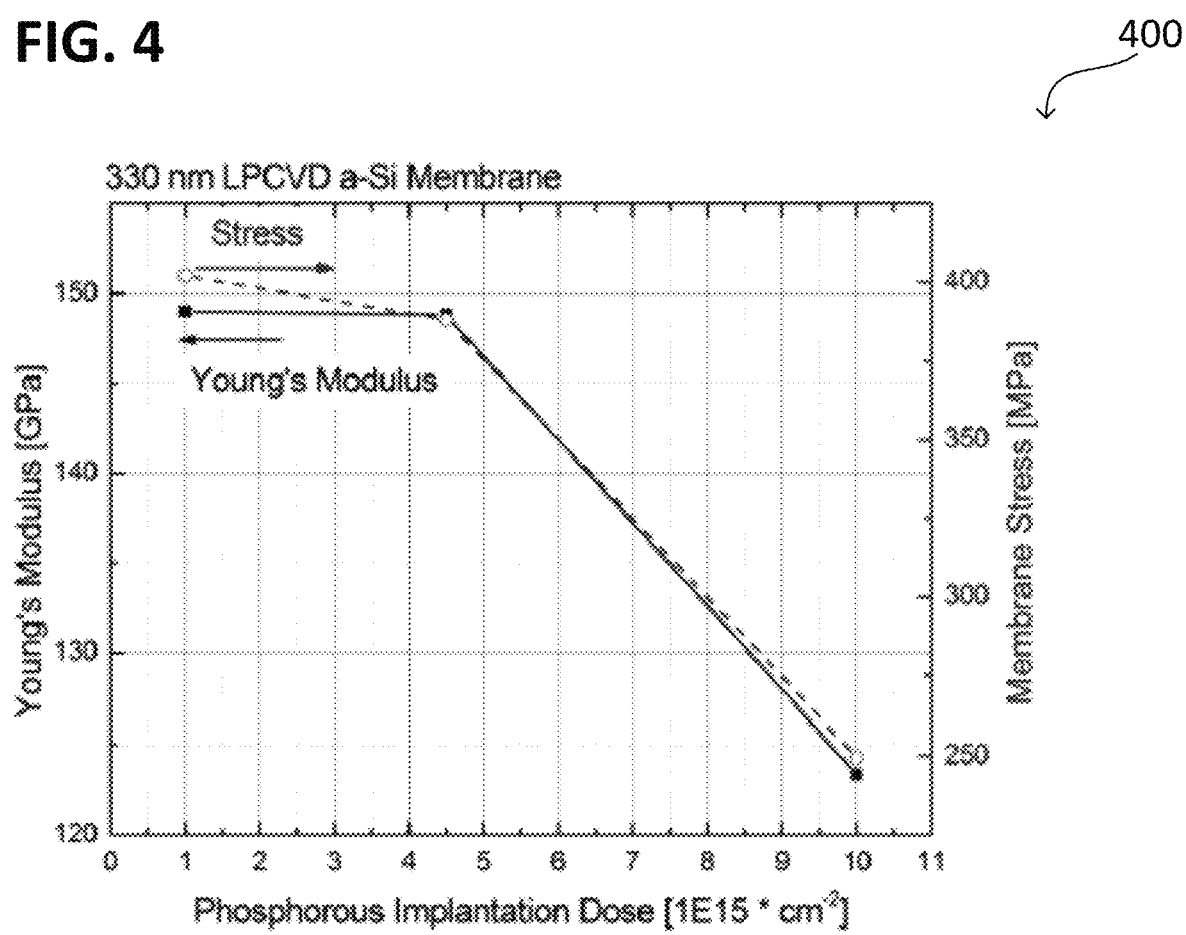
FIG. 4 shows a diagram illustrating the reduction of the elastic modulus of silicon by means of an implantation of phosphorous into the silicon.
Figure 5A:
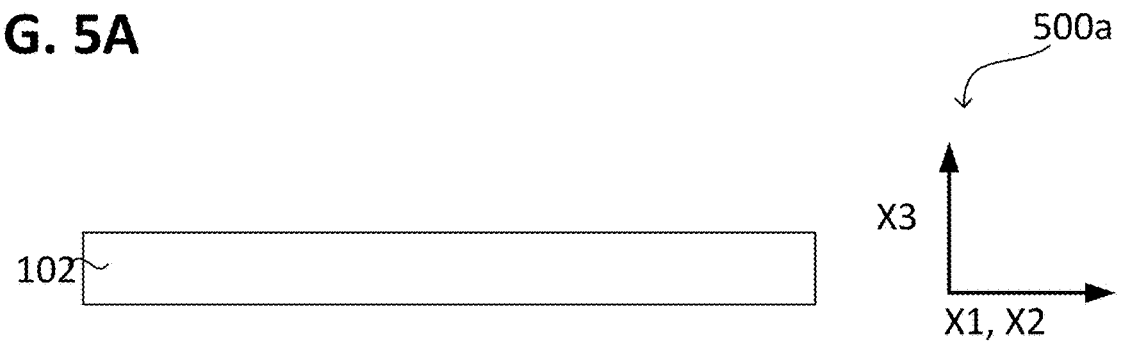
FIG. 5A to 5D show each a method according to various embodiments, in a schematic cross-sectional view illustrating a possible implementation of a functional structure in a micromechanical structure.
Figure 5B:
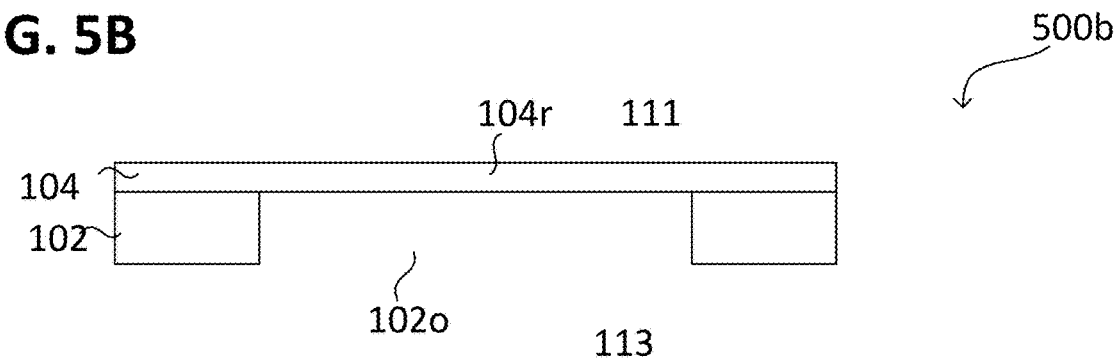
Figure 5C:
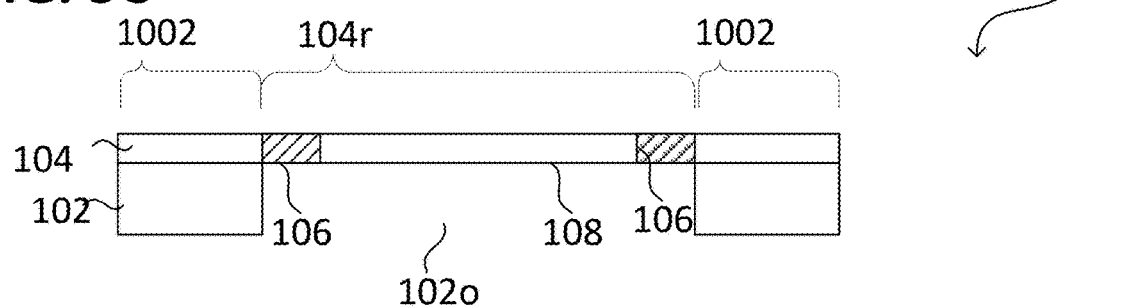
Figure 5D:
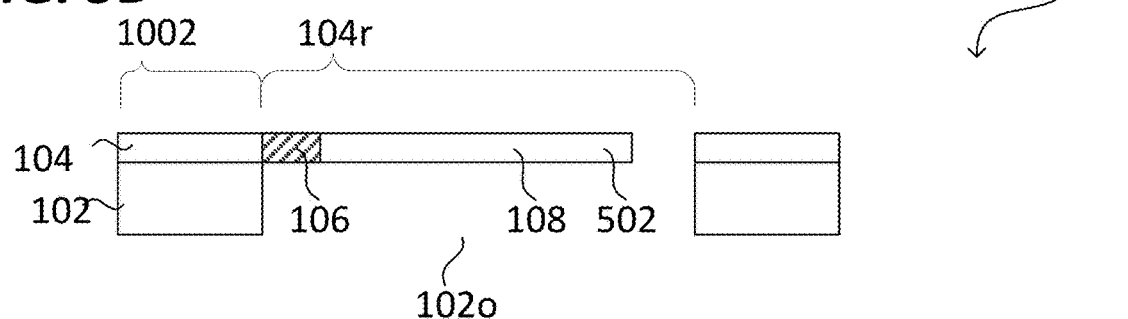

FIG. 4 shows in diagram 400, as an example, the reduction of the elastic modulus of silicon by means of an implantation of phosphorous into the silicon. In accordance with one or more embodiments at least one chemical element may be implanted, e.g., others than phosphorous or additional to phosphorous.

In accordance with various embodiments, an implantation of at least one of phosphorous (P), carbon (C), nitrogen (N), oxygen (O), boron (B), fluorine (F), or any other implantable impurity known as such in the art, into any of the aforementioned materials or material combinations (i.e., a-SiC:H, etc.) may be applied. The elastic modulus, hardness (or softness) and/or stiffness of the resulting material (i.e., after implantation of the one or more impurities) may, for example, be adjusted by the implantation dose (and, possibly, by a subsequent annealing step). In accordance with some embodiments, an implantation dose may be in the range from $10^{14}$ $cm^{-2}$ to $10^{19}$ $cm^{-2}$, although other implantation doses may be possible as well in accordance with some embodiments.

In accordance with some embodiments, a resulting stress or tension (tensile stress) of the layer may be set or adjusted by means of the implantation and/or by means of the annealing.

A beneficial effect of the implantation/doping may be the possibility to change or influence layer characteristics or properties locally within a layer. Furthermore, the doping profile may be set or adjusted by choosing suitable implantation conditions, e.g. implantation energy and/or dose, and/or by annealing.

FIG. 5A, FIG. 5B, FIG. 5C and FIG. 5D show each a method according to various embodiments, in a schematic cross-sectional view (e.g., a cross section perpendicular to a functional plane).

The method may include in 500a: providing a substrate 102. According to various embodiments, a substrate 102 may include or be formed from a semiconductor material of various types, including a group IV semiconductor (e.g. silicon or germanium), a compound semiconductor, e.g. a group III-V compound semiconductor (e.g. gallium arsenide) or other types, including group III semiconductors, group V semiconductors or polymers, for example. In an embodiment, the substrate is made of silicon (doped or undoped), in an alternative embodiment, the substrate is a silicon on insulator (SOI) wafer. As an alternative, any other suitable semiconductor material can be used for the substrate, for example a semiconductor compound material such as gallium phosphide (GaP), indium phosphide (InP), silicon carbide (SiC) or gallium nitride (GaN), but also any suitable ternary semiconductor compound material or quaternary semiconductor compound material such as indium gallium arsenide (InGaAs).

The method may further include in 500b: arranging a functional structure 104 at (e.g., in or over) the substrate 102. The functional structure 104 may include or be formed from a functional region 104r (including or made from at least one layer). The functional region 104r may be configured to deflect (e.g., into a direction perpendicular to an extension of the functional region 104r, in other words, into a direction perpendicular to a functional plane X1, X2) responsive to a signal acting on the functional region 104r, e.g., a mechanical signal and/or an electromagnetic signal. The signal may include or be formed from a force, e.g., an electromagnetic force and/or a mechanical force. The functional region 104r may be extended along and/or parallel to the functional plane X1, X2.

By way of example, the functional structure 104 may include or be formed from at least one layer and/or from a base material. To be deflectable, the functional region 104r may be exposed on opposite sides, e.g., on a first side 111 opposite the substrate 102 and a second side 113. For example, a recess 102o or opening 102o may be formed in the substrate 102 to expose the functional region 104r on the second side 113. Further, the functional structure 104 may include at least one clamp region 1002, which may be supported by the substrate 102, e.g., by a physical contact with the substrate 102.

The method may further include in 500c and in 500d: forming at least a section 106 of the functional region 104r having an elastic modulus in the range from about 5 GPa to about 70 GPa. The at least a section 106 may include or be formed from at least one section 106, e.g., one section 106, two sections 106, three sections 106, four sections 106, five sections 106, or more than five sections 106.

For example, in 500c or in 500d a modification step may be performed, e.g., after forming the functional structure 104 (e.g., its functional region 104r). The modification step may include modifying (e.g., locally) the mechanical properties (e.g., the elastic modulus, the mechanical hardness and/or the stiffness) of the functional region 104r in the at least a section 106, e.g., by changing the chemical composition (e.g., by at least one of implantation of impurities and reactive addition of impurities). Changing the chemical composition may include adding impurities to the functional region 104r, e.g., to the base material of the functional region 104r (e.g., in the at least a section 106). The impurities may include or be formed from at least one of phosphorous, carbon, nitrogen, oxygen, boron, fluorine, gallium, germanium, arsenic.

According to various embodiments, the base material may include or be formed from at least one of the following materials: polysilicon, amorphous hydrogenated silicon carbide (a-SiC:H), amorphous hydrogenated carbon (a-C:H), amorphous hydrogenated silicon nitride (a-SiN:H), amorphous hydrogenated silicon carbooxide (a-SiCO:H), aluminum, gallium, germanium, indium, arsenic, antimony, cadmium, tellurium, selenium, zinc, or combinations (e.g., compounds) thereof with at least one of silicon, carbon, nitrogen, oxygen, hydrogen. For example, the at least a section 106 of the functional region 104r may include or be formed from a-SiC:H.

The modification step may include reducing the elastic modulus (also referred to as Young's modulus) of the functional region 104r in the at least a section 106 (also referred to as at least a first section 106, e.g., at least one first section 106). Alternatively or additionally, the modification step may include reducing at least one of in the at least a section 106: the hardness, elasticity (elastic modulus) and/or stiffness.

The functional region 104r may in 500c provide a membrane (also referred to as diaphragm). The membrane may be configured to provide a maximum deflection in a centered section, distant from the substrate 102 or respective clamping regions 1002. The membrane may be understood as a rigid structural element, such as a plate, anchored at one or more circumferential regions to a (e.g., laterally disposed and/or surrounding) support which it spans. When subjected to a mechanical load, the membrane carries the load to the support where it is forced against by a moment and shear stress. The membrane may be supported by the substrate 102.

The functional region 104r may in 500d provide a cantilever. The cantilever may be configured to provide a maximum deflection at an open end 502 of the cantilever. The open end 502 may be separated from the substrate 102, e.g., by a gap. A cantilever may be understood as a rigid structural element, such as a beam or a plate, anchored at only one end or region to a (e.g., laterally disposed) support from which it is protruding. When subjected to a mechanical load, the cantilever carries the load to the support where it is forced against by a moment and shear stress. The cantilever may be supported by the substrate 102. Opposite to the support, the cantilever may include the open end 502 (in other words, an unsupported end or region).

At least one of the elastic modulus, the stiffness and/or the mechanical hardness of the at least a section 106 of the functional region 104r may be less than (e.g., less than about 75%, 50%, 25%, or less than about 10% of) the respective elastic modulus, stiffness and/or mechanical hardness of at least another section 108 (also referred to as at least a second section 108, e.g., at least one second section 108) of the functional region 104r adjacent to the at least a section 106 of the functional region 104r. Alternatively or additionally, the elastic modulus of the at least a section 106 of the functional region 104r may be in the range from about 5 GPa to about 70 GPa, e.g., in the range from about 10 GPa to about 60 GPa. The at least another section 108 may include or be formed from at least one section 108, e.g., one section 108, two sections 108, three sections 108, four sections 108, five sections 108, or more than five sections 108.

The micromechanical structure may be used in a microelectromechanical system (MEMS), such as a microphone and/or loudspeaker, on the micro-scale. A MEMS microphone may have at least one electrode and a diaphragm and may be configured as a transducer.

According to various embodiments, a micromechanical structure may be formed in semiconductor technology. For example, a semiconductor chip may include the micromechanical structure. In other words, the micromechanical structure may be implemented into (e.g., may be part of) a semiconductor chip, e.g., monolithically integrated. The semiconductor chip (which may also be referred to as a chip, die, or microchip) may be processed in or on the substrate 102 (e.g., as part of or being a wafer 102 or a carrier 102). The semiconductor chip may include one or more micromechanical structures, which are formed during semiconductor technology processing or fabrication. The substrate 102 may be part of the semiconductor chip, e.g., the substrate may be part of, or may form, a semiconductor body of the chip. Optionally, the micromechanical structure may be part of, or may be electrically coupled to, an integrated circuit on the chip.

According to various embodiments, the substrate 102 (e.g., of a micromechanical structure, e.g., the semiconductor substrate of a semiconductor chip) may be singulated from a wafer by removing material from a kerf region of the wafer (also referred to as dicing or cutting the wafer). For example, removing material from the kerf region of the wafer may be processed by scribing and breaking, cleavage, blade dicing, laser dicing, plasma dicing, or mechanical sawing (e.g., using a dicing saw). In other words, the substrate 102 may be singulated by a wafer dicing process. After the wafer dicing process, the substrate 102 (or the finished micromechanical structure) may be electrically contacted and encapsulated, e.g., by mold materials, into a chip carrier (which may also be referred to as a chip housing) which may then be suitable for use in electronic devices, such as sensors or transducers. For example, the semiconductor chip may be bonded to a chip carrier by wires. Alternatively or additionally, the semiconductor chip (which may be bonded to a chip carrier) may be mounted (e.g., soldered) onto a printed circuit board.

According to various embodiments, the micromechanical structure may be configured to at least one of: provide a force to actuate the functional structure (e.g., a diaphragm or a cantilever) in response to an electrical signal transmitted to an electrode (e.g., a backplate) and/or provide an electrical signal in response to an actuation of the functional structure. In general, a micromechanical structure may be configured to convert mechanical energy into electrical energy or vice versa. In other words, a micromechanical structure may function as a transducer. A micromechanical structure (e.g., its functional region 104r) may have a size (e.g., a diameter or a lateral width) in the range from about a few micrometers (μm) to about a few millimeters (mm), e.g., in the range from about 10 μm to about 5 mm, e.g., in the range from about 100 μm to about 2 mm, e.g., about 1 mm, e.g., in the range of 0.5 mm to 1.5 mm, or, alternatively, smaller than about 1 mm, e.g., smaller than about 500 μm, e.g., smaller than about 100 μm.

A micromechanical structure according to various embodiments may be used as a sensor (e.g., a micro-sensor) for sensing a mechanical signal and to generate an electrical signal, which represents the mechanical signal. Alternatively, a micromechanical structure may be used as an actuator for generating a mechanical signal based on the electrical signal. For example, the micromechanical structure may be used as microphone or as a speaker (loudspeaker).

The method may optionally include in 500c and in 500d: annealing the functional region 104r (e.g., its base material having the introduced impurities), e.g., by bringing functional region 104r to the annealing temperature.

Figure 6A:
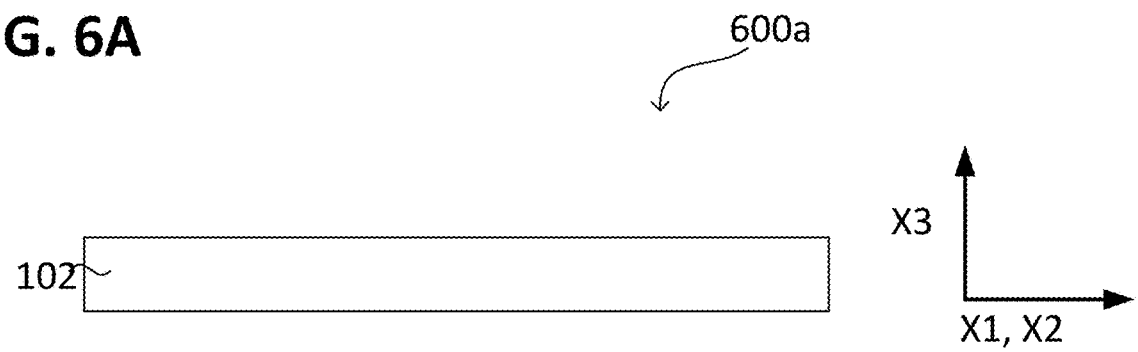
FIG. 6A to 6C show each a method according to various embodiments, in a schematic cross-sectional view illustrating a possible implementation of a functional structure in a micromechanical structure.
Figure 6B:
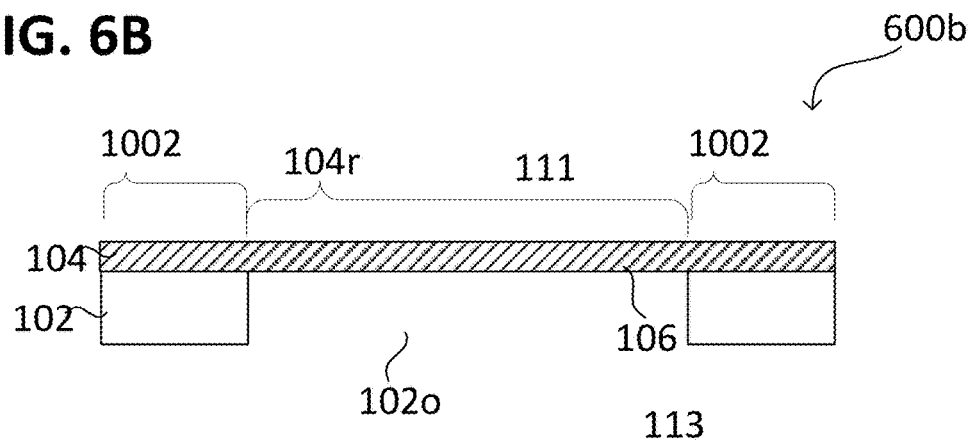
Figure 6C:
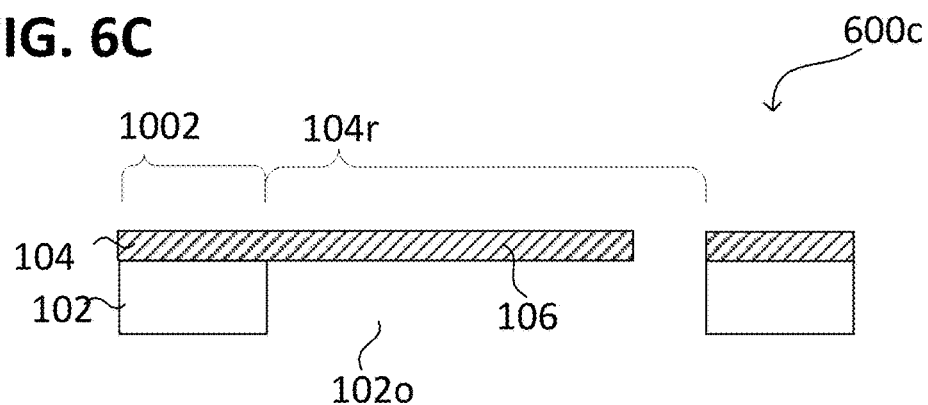
Figure 7A:
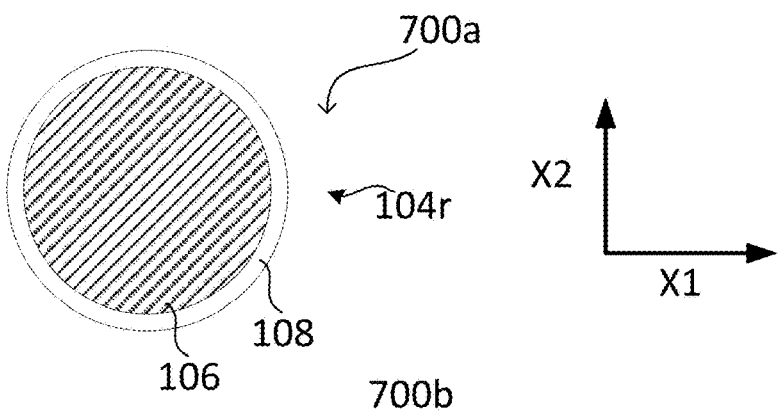
FIG. 7A to 7D show each a schematic top or bottom view of a possible implementation of a functional structure in a round membrane according to various embodiments.
Figure 7B:
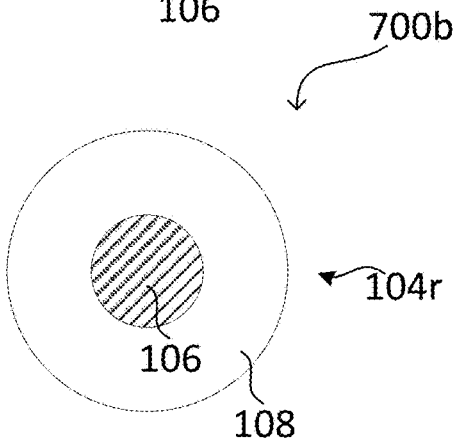
Figure 7C:
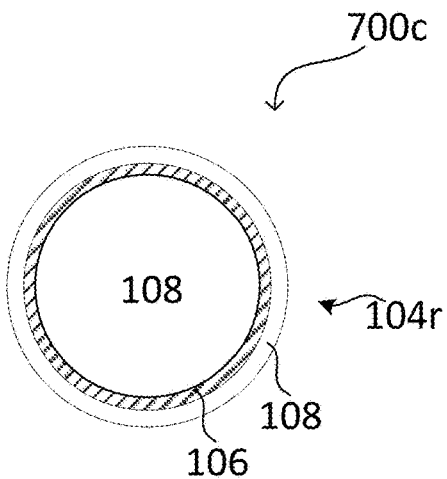
Figure 7D:
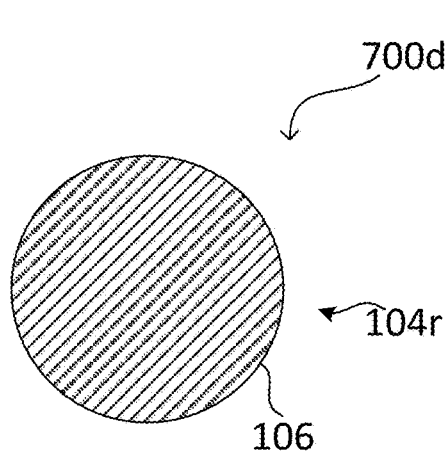

FIG. 6A, FIG. 6B, and FIG. 6C show each a method according to various embodiments, in a schematic cross-sectional view (e.g., a cross section perpendicular to a functional plane).

The method may include in 600a: providing a substrate 102 (e.g., configured as described before).

The method may further include in 600b and 600c: arranging a functional structure 104 at (e.g., in or over) the substrate 102. The functional region 104r may provide in 600b a membrane (also referred to as diaphragm) and in 600c a cantilever.

The method may further include in 600b and in 600c: forming at least a section 106 of the functional region 104r having an elastic modulus in the range from about 5 GPa to about 70 GPa. For example, in 600b and in 600c implanting impurities into the base material may be carried out before arranging the functional structure 104 at the substrate 102. For example, the base material including the impurities may be deposited over the substrate 102 to form the functional structure 104. Therefore, the entire functional region 104r may include the impurities. In other words, the entire functional region 104r may be formed from the at least a section 106 of the functional region 104r.

The base material and the impurities may be configured as described before. In other words, at least one of the elastic modulus the stiffness and/or mechanical hardness of the base material may be reduced with increasing concentration (e.g., atomic ratio or weight ratio) of impurities in the base material.

The method may optionally include in 600b and in 600c: annealing the functional region 104r (e.g., its base material having the introduced impurities), e.g., by bringing the functional region 104r to the annealing temperature.

FIG. 7A, FIG. 7B, FIG. 7C and FIG. 7D show each a functional structure according to various embodiments, in a schematic top or bottom view (in other words, a view direction perpendicular to the functional plane X1, X2, e.g., from the first side). The functional structure may include a functional region 104r exemplarily having a round shape. Beside the illustrated round shape, the functional region 104r may have other shapes such as a rectangular, an elliptical, a polygon shape or a combination thereof. Alternatively or additionally, the functional region 104r may be formed as a convex or concave curved region.

The functional structure 700a may include or be formed from both, the at least a section 106 (also referred to as at least a first section 106) and the at least another section 108 (also referred to as at least a second section 108). The at least a second section 108 of the functional region 104r may be proximate an edge or rim (e.g., include the edge or rim) of the functional region 104r. For example, the at least a first section 106 of the functional region 104r may include or be formed from more than about 90% (e.g., more than about 95% or more than about 99%) of the functional region 104r (e.g., measured as area). Alternatively or additionally, a diameter of the at least a first section 106 of the functional region 104r may be more than about 90% (e.g., more than about 95% or more than about 99%) of a diameter of the at least a second section 108 of the functional region 104r.

The functional structure 700b may include or be formed from the at least a first section 106 of the functional region 104r and the at least a second section 108 of the functional region 104r. For example, the at least a first section 106 of the functional region 104r may include or be formed from less than about 90% (e.g., less than about 50% or less than about 25%) of the functional region 104r (e.g., measured as area). Alternatively or additionally, a diameter of the at least a first section 106 of the functional region 104r may be less than about 90% (e.g., less than about 50% or less than about 25%) of a diameter of the at least a second section 108 of the functional region 104r.

The functional structure 700c may include or be formed from the at least one first section 106 of the functional region 104r arranged between two second sections 108 of the functional region 104r.

The functional region 104r of the functional structure 700d may be formed from the at least a first section 106.

According to various embodiments, a concentration (e.g., atomic ratio or weight ratio) of impurities in the or each second section 108 of the functional region 104r (e.g., in its base material) may be less than (e.g., about 75%, 50%, 25%, 10% or about 0% of) an atomic ratio or weight ratio of impurities in the or each first section 106 of the functional region 104r (e.g., in its base material).

Figure 8A:
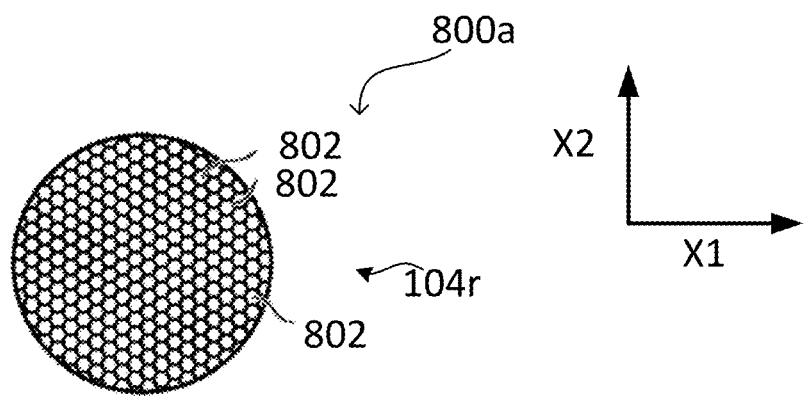
FIG. 8A to 8C show each a schematic top or bottom view of a possible implementation of a functional structure in a round membrane according to various embodiments.
Figure 8B:
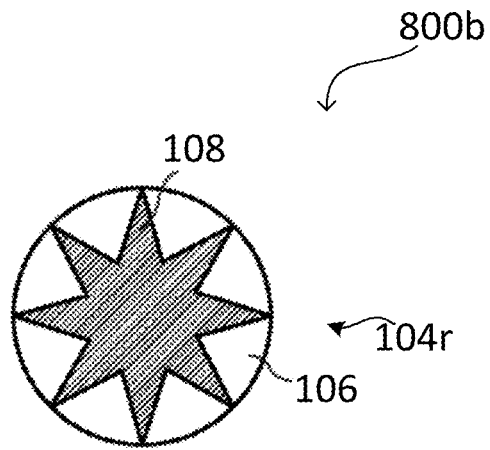
Figure 8C:
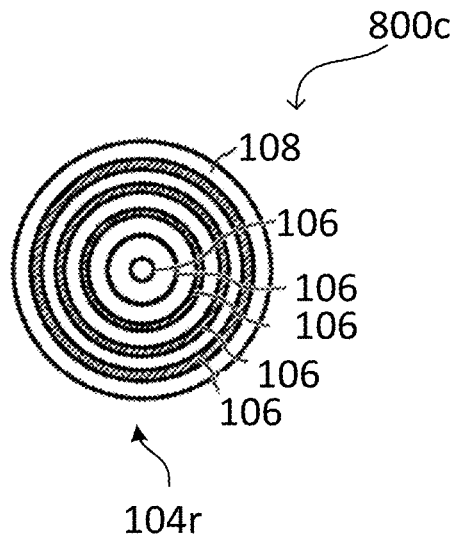

FIG. 8A, FIG. 8B and FIG. 8C show each a functional structure according to various embodiments, in a schematic top or bottom view (in other words, a view direction perpendicular to the functional plane X1, X2, e.g., from the first side). The functional structure may include a functional region 104r exemplarily having a round shape. Beside the illustrated round shape, the functional region 104r may have other shapes such as a rectangular, an elliptical, a polygon shape or a combination thereof. Alternatively or additionally, the functional region 104r may be formed as a convex or concave curved region.

The functional structure 800a (e.g., its functional region 104r) may include or be formed from a honeycomb structure including a plurality of first sections 106 in shape of honeycombs 802. The honeycomb structure may entirely extend through the functional region 104r, wherein according to alternative embodiments the honeycomb structure may extend through only a part of the functional region 104r. The honeycombs 802 may have a polygon shape such as a hexagon shape. The at least a second section 108 of the functional region 104r may be disposed between the honeycombs 802.

In an alternative embodiment, the functional structure 800a (e.g., its functional region 104r) may include a honeycomb structure including a plurality of second sections 108 in shape of honeycombs 802. The at least a first section 106 of the functional region 104r may be disposed between the honeycombs 802.

The functional structure 800b may include at least a second section 108 of the functional region 104r in a star shape, e.g., extending from the center section to an outer circumference (illustratively, the rim) of the functional region 104r. The star shape may be obtained, for example, by a plurality of rhomb shapes that are rotated by an angle, for example, such as 45°, to each other, wherein a pair of rhomb shapes may be arranged diagonally on the functional region 104r. For example, the functional region 104r may be clamped or mounted to the substrate 102 at ends (beams or rays) of the star shape or at the plurality of first sections 106 of the functional region 104r that are disposed between the ends of the star shape.

The functional structure 800c may include a plurality of first sections 106 of the functional region 104r. Each first section of the plurality of first sections 106 may be formed as a ring structure differing in one or more ring parameters (e.g., in their diameter, center point and/or width of the respective ring) and/or coincide in one or more ring parameters (e.g., in their center point and/or width). For example, the plurality of first sections 106 may be disposed concentrically with respect to each other and/or to the center section of the functional region 104r. Illustratively, the plurality of first sections 106 of the functional region 104r may form a multi-ring structure. Adjacent first sections of the plurality of first sections 106 may be separated from each other by at least one second section 108 of the at least a second section 108.

Figure 9A:
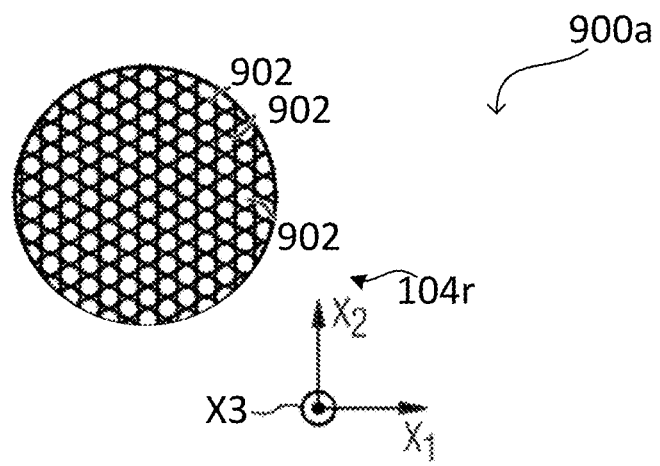
FIG. 9A to 9C show each a schematic top or bottom view of a possible implementation of a functional structure in a round membrane according to various embodiments.
Figure 9B:
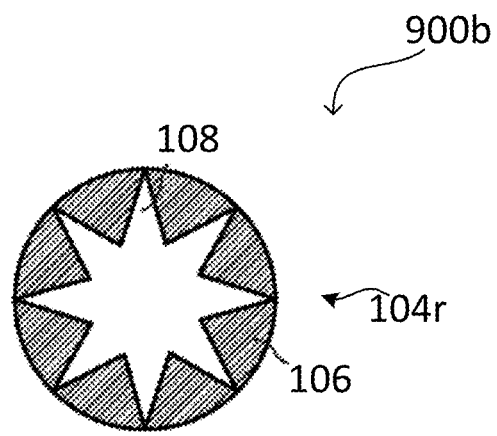
Figure 9C:
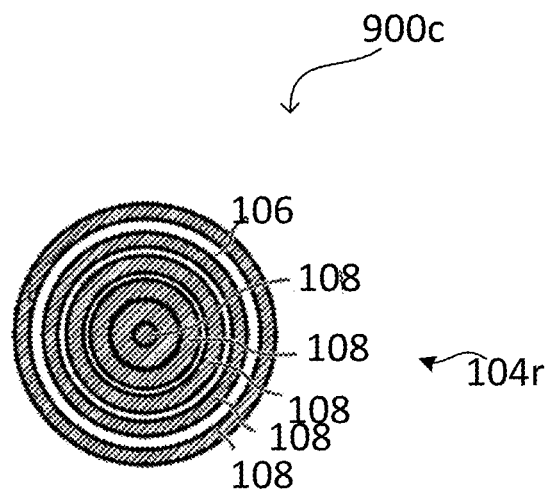
Figure 10A:
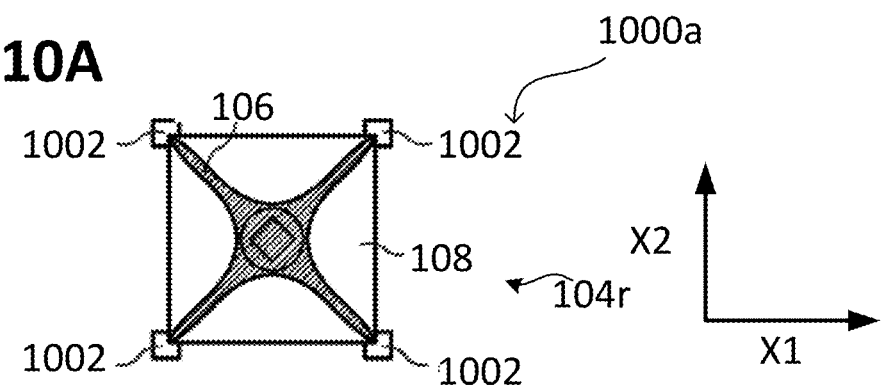
FIG. 10A to 10D show each a schematic top or bottom view of a possible implementation of a functional structure in a rectangular membrane according to various embodiments.
Figure 10B:
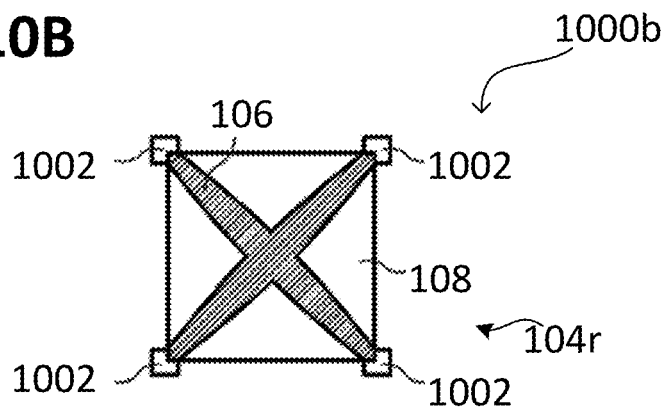
Figure 10C:
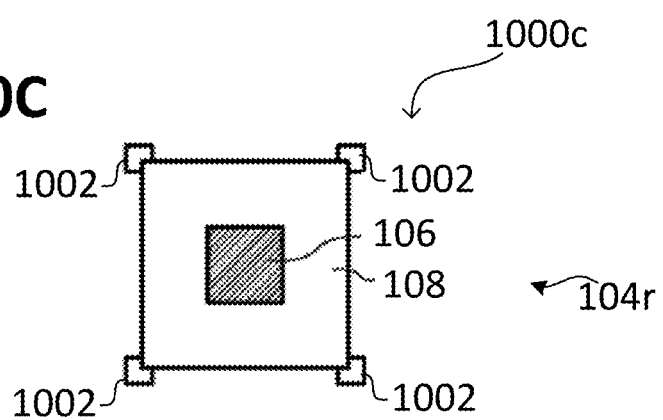
Figure 10D:
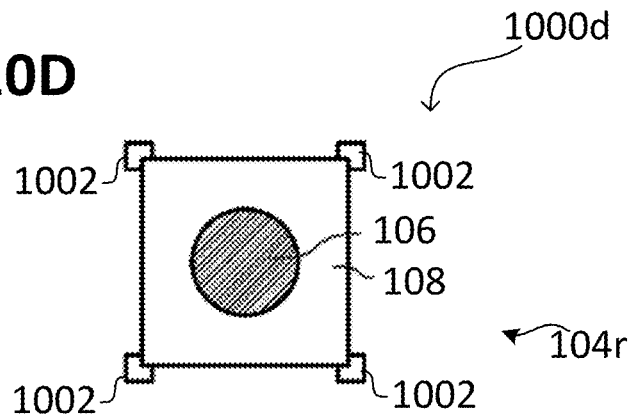
Figure 11A:
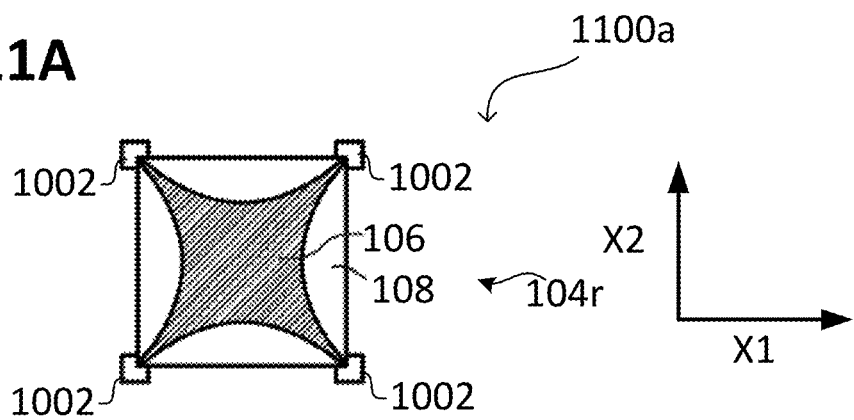
FIG. 11A to 11D show each a schematic top or bottom view of a possible implementation of a functional structure in a rectangular membrane according to various embodiments.
Figure 11B:
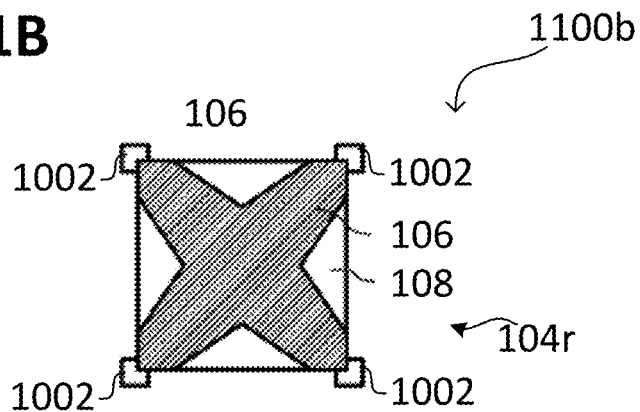
Figure 11C:
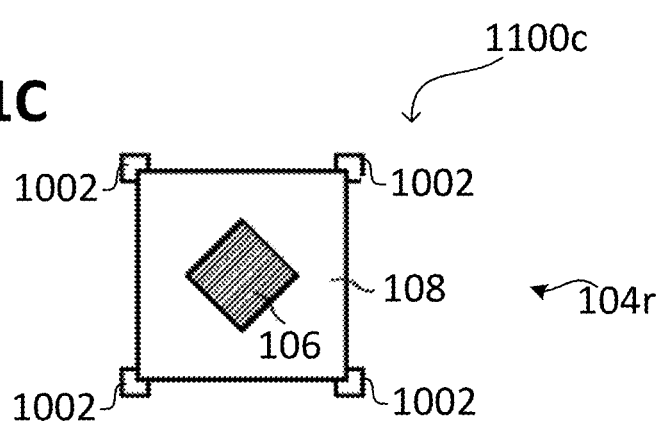
Figure 11D:
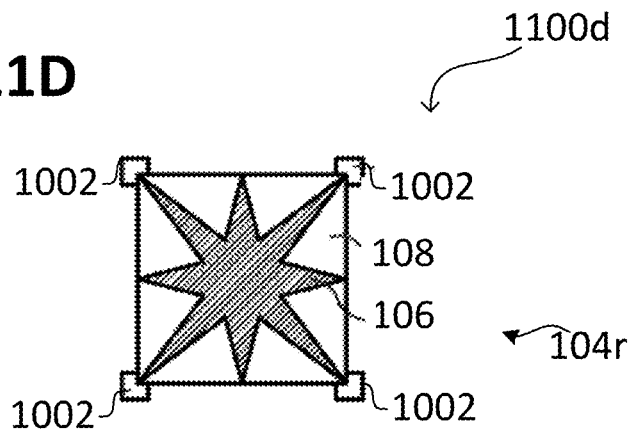
Figure 12A:
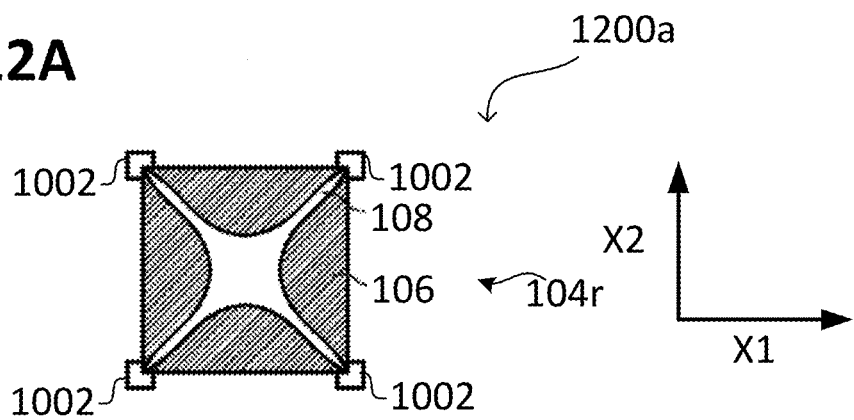
FIG. 12A to 12D show each a schematic top or bottom view of a possible implementation of a functional structure in a rectangular membrane according to various embodiments.
Figure 12B:
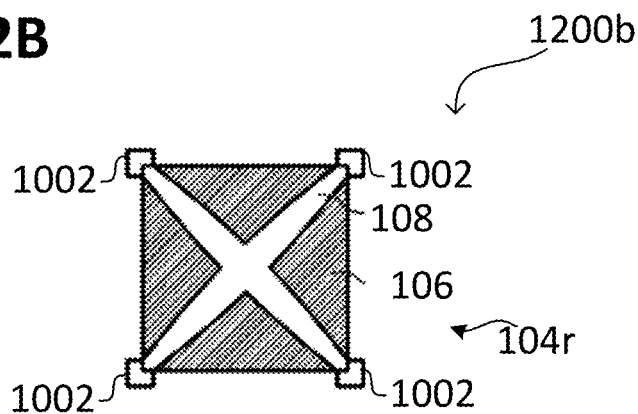
Figure 12C:
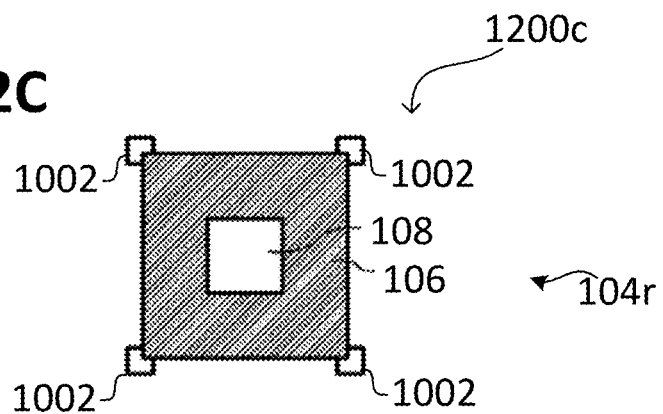
Figure 12D:
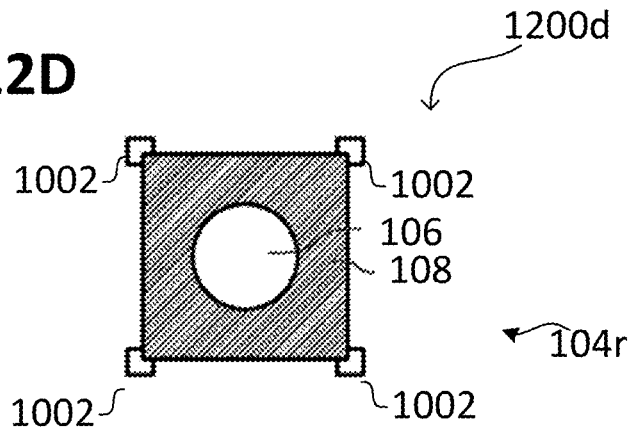
Figure 13A:
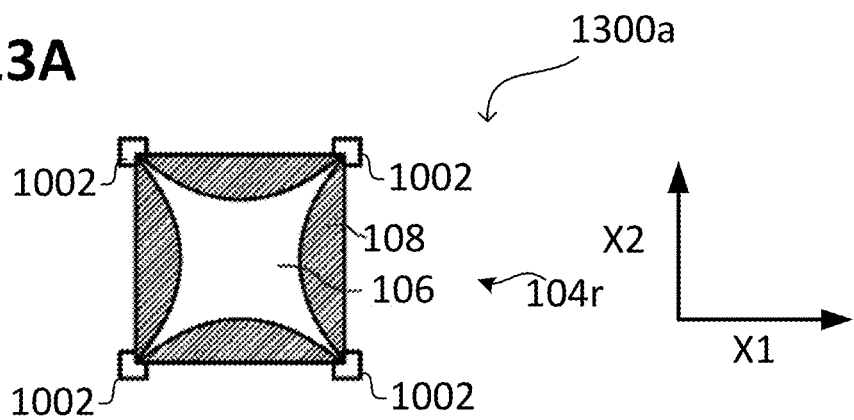
FIG. 13A to 13D show each a schematic top or bottom view of a possible implementation of a functional structure in a rectangular membrane according to various embodiments.
Figure 13B:
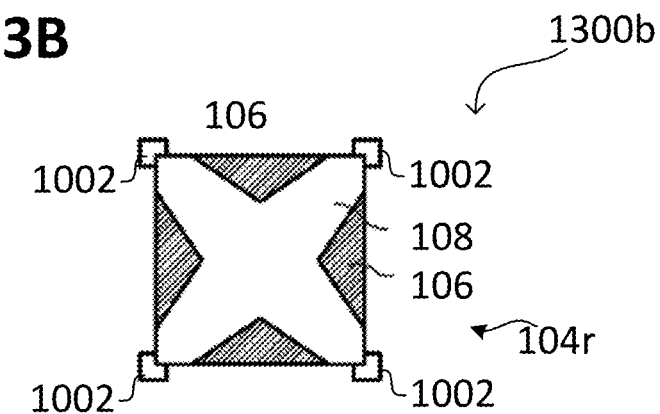
Figure 13C:
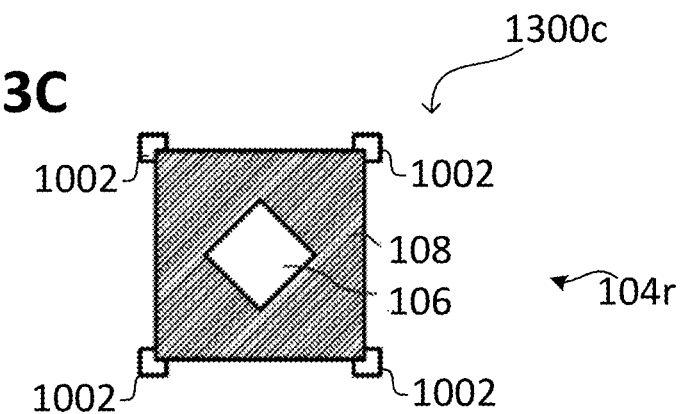
Figure 13D:
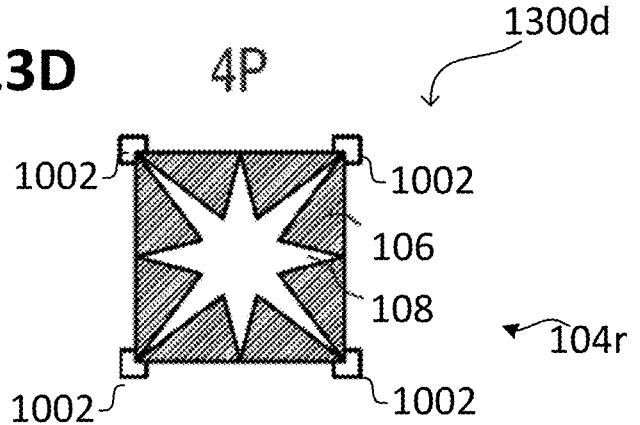
Figure 14A:
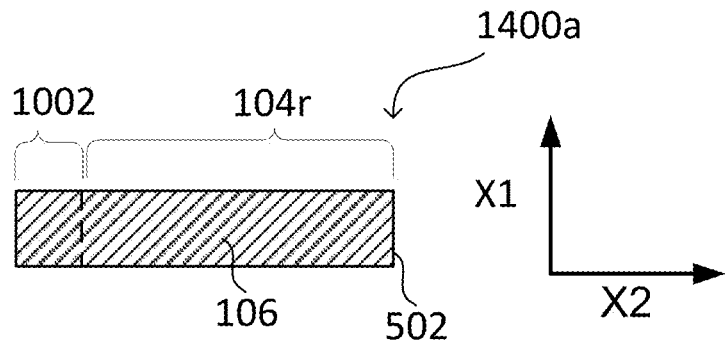
FIG. 14A to 14D show each a schematic cross-sectional view of a possible implementation of a functional structure in a cantilever structure according to various embodiments.
Figure 14B:
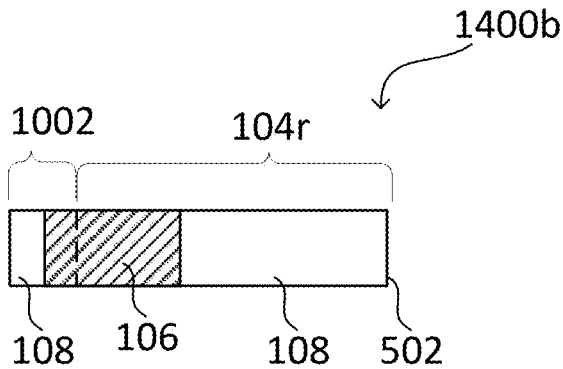
Figure 14C:
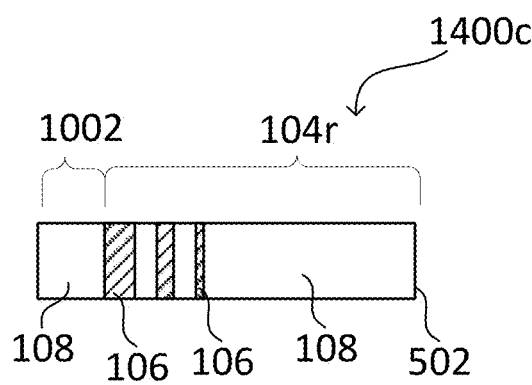
Figure 14D:
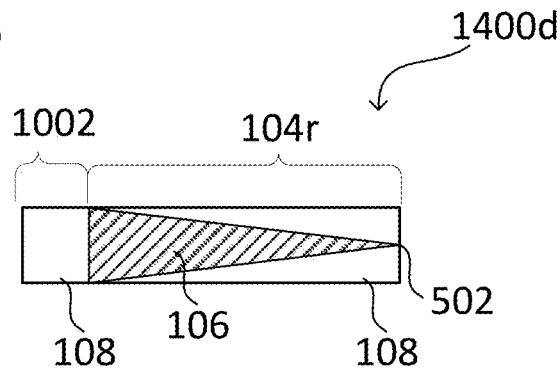

FIG. 9A, FIG. 9B and FIG. 9C show each a functional structure according to various embodiments, in a schematic top view or bottom view (in other words, a view direction perpendicular to the functional plane X1, X2, e.g., from the first side). The functional structure may include a functional region 104r exemplarily having a round shape. Beside the illustrated round shape, the functional region 104r may have other shapes such as a rectangular, an elliptical, a polygon shape or a combination thereof. Alternatively or additionally, the functional region 104r may be formed as a convex or concave curved region.

The functional structure 900a may include or be formed from a circle structure including a plurality of second sections 108 in shape of circles 902. The circle structure may entirely extend through the functional region 104r, wherein according to alternative embodiments the circle structure may extend through only a part of the functional region 104r. The circles 902 may have a round shape. The at least a first section 106 of the functional region 104r may be disposed between the circles 902.

In an alternative embodiment, the functional structure 900a (e.g., its functional region 104r) may include or be formed from a circle structure including a plurality of first regions 106 in shape of circles 902. The at least a second section 108 of the functional region 104r may be disposed between the circles 902.

The functional structure 900b may include at least one first section 106 of the functional region 104r in a star shape, e.g., extending from the center section to an outer circumference of the functional region 104r. For example, the functional region 104r may be clamped or mounted to the substrate 102 at ends (beams or rays) of the star shape or at a plurality of second sections 108 of the functional region 104r that are disposed between the ends of the star shape.

The functional structure 900c may include a plurality of second sections 108 of the functional region 104r. Each second section 108 of the plurality of second sections 108 may be formed as a ring structure, e.g., differing in one or more ring parameters (e.g., in their diameter, center point and/or width of the respective ring) and/or coincide in one or more ring parameters (e.g., in their center point and/or width). For example, the plurality of second sections 108 may be disposed concentrically with respect to each other and/or to the center section of the functional region 104r. Illustratively, the plurality of second sections 108 of the functional region 104r may form a multi-ring structure. Adjacent second sections of the plurality of second sections 108 may be separated from each other by at least one first section 106 of the at least a first section 106.

FIG. 10A, FIG. 10B, FIG. 10C and FIG. 10D show each a functional structure according to various embodiments, in a schematic top or bottom view (in other words, a view direction perpendicular to the functional plane X1, X2, e.g., from the first side). The functional structure may include a functional region 104r exemplarily having a rectangular (e.g., quadratic) shape. Beside the illustrated rectangular shape, the functional region 104r may have other polygonal shapes or a round, e.g., elliptical, shape or a combination thereof. Alternatively or additionally, the functional region 104r may be formed as a convex or concave curved region.

The functional region 104r may be clamped at clamping regions 1002. The micromechanical structure (e.g., its functional structure) may be used in a sound transducing device, for example, a microphone or a loudspeaker.

The functional structure 1000a (e.g., its functional region 104r) may include or be formed from a plurality of (e.g., four) second sections 108 having a shape that may be obtained by a superposition of four hyperbolical structures being oppositely arranged each between two clamping regions 1002. The plurality of (e.g., four) second sections 108 may be separated from each other by the at least a first section 106. Optionally, in the center section of the functional region 104r a circular structure including a second section 108 may be arranged. In general, the shape of the or each first section 106 may be obtained by a superposition of two or more geometrical structures or shapes and/or subtraction of two or more geometrical structures or shapes. In analogy, the shape of the or each second section 108 may be obtained by a superposition of two or more geometrical structures or shapes and/or subtraction of two or more geometrical structures or shapes.

The functional structure 1000b may include or be formed from at least one first section 106 of the functional region 104r having a shape that may be obtained by a superposition of two elliptical structures being diagonally arranged between the clamping regions 1002. The remaining functional region 104r may be formed from the respective second sections 108.

The functional structure 1000c may include at least one first section 106 of the functional region 104r having a shape similar to the shape of the functional region 104r. As visible in the figure, the at least one first section 106 may be formed quadratic with an edge length smaller than a corresponding edge length of at least one of the functional region 104r and the at least one second section 108 of the functional region 104r. By way of example, the edges of the at least one first section 106 of the functional region 104r and the edges of the functional region 104r (e.g., its at least a second section 108) may be substantially parallel to each other. The at least one first section 106 of the functional region 104r may be disposed in or form the center section of the functional region 104r (e.g., surrounded by its at least a second section 108).

The functional structure 1000d may include or be formed from at least one first section 106 of the functional region 104r having a round shape. The at least one first section 106 of the functional region 104r may be disposed in the center section of the functional region 104r (e.g., surrounded by its at least a second section 108).

FIG. 11A, FIG. 11B, FIG. 11C and FIG. 11D show each a functional structure according to various embodiments, in a schematic top view or cross-sectional view (in other words, a view direction perpendicular to the functional plane X1, X2, e.g., from the first side).

The functional structure 1100a may include or be formed from at least one first section 106 of the functional region 104r having a shape that may be obtained by sparing shape regions of the functional region 104r that may be formed by ellipses circles or one or more ellipses or parts of them, wherein, for example, a center of a circle or a special point of an or each ellipse may be disposed outside the functional region 104r.

The functional structure 1100b may include or be formed from at least one first section 106 of the functional region 104r having a shape that may be obtained by sparing shape regions of the functional region 104r that may be formed by rhombs (e.g., squares) or parts of them, wherein, for example, a center of a or each square or rhomb may be disposed outside the functional region 104r.

The functional structure 1100c may include or be formed from at least one first section 106 of the functional region 104r having a shape similar to the shape of the functional region 104r (for example, quadratic), with an edge length smaller than a corresponding edge length of the functional region 104r (e.g., its at least a second section 108). By way of example, the edges of the at least one first section 106 of the functional region 104r and the edges of the functional region 104r (e.g., its at least a second section 108) may be inclined to each other. The at least one first section 106 of the functional region 104r may be disposed in or form the center section of the functional region 104r (e.g., surrounded by its at least a second section 108). The at least one first section 106 of the functional region 104r may, for example, be rotated by an angle of 45° with respect to the functional region 104r. Alternatively, the angle may be in the range between 0° and 360°, 0° and 180° or between 0° and 90°.

The functional structure 1100d may include the at least a first section 106 of the functional region 104r in a star shape, e.g., extending from the center section to an outer circumference of the functional region 104r, e.g., to the clamping regions 1002. The star shape may be obtained, for example, by a plurality of rhomb shapes that are rotated by an angle, for example, such as 45°, to each other, wherein a pair of rhomb shapes may be arranged diagonally on the functional region 104r.

FIG. 12A, FIG. 12B, FIG. 12C and FIG. 12D show each a functional structure according to various embodiments, in a schematic top view or bottom view (in other words, a view direction perpendicular to the functional plane X1, X2, e.g., from the first side).

The functional structures 1200a, 1200b, 1200c and 1200d may be similar to those shown in FIG. 10A to FIG. 10D, wherein the or each first section 106 of the functional region 104r is exchanged with the or each second section 108 of the functional region 104r.

FIG. 13A, FIG. 13B, FIG. 13C and FIG. 13D show each a functional structure according to various embodiments, in a schematic top view or bottom view (in other words, a view direction perpendicular to the functional plane X1, X2, e.g., from the first side).

The functional structures 1300a, 1300b, 1300c and 1300d may be similar to those shown in FIG. 11A to FIG. 11D, wherein the or each first section 106 of the functional region 104r is exchanged with the or each second section 108 of the functional region 104r.

FIG. 14A, FIG. 14B, FIG. 14C and FIG. 14D show each a functional structure according to various embodiments, in a schematic top view or bottom view (in other words, a view direction perpendicular to the functional plane X1, X2, e.g., from the first side). The or each micromechanical structure (e.g., its functional structure) may include or be formed from a cantilever. The functional region 104r may be shaped as a beam or a plate, for example, having a rectangular (e.g., quadratic) shape or cross section. The functional region 104r may be supported by a clamping region 1002 of the micromechanical structure.

The functional region 104r of the functional structure 1400a may formed (entirely) from the at least a first section 106 (e.g., its material composition).

The functional structure 1400b may include at least one first section 106 of the functional region 104r proximate the clamping region 1002, e.g., extending into the clamping region 1002. Further, the functional structure 1400b may include at least one second section 108 of the functional region 104r distant from the clamping region 1002 (e.g., proximate the open end of the cantilever). Optionally, the clamping region 1002 may include at least one further second section 108. For example, the functional structure 1400*b* may include at least one first section 106 disposed between two second sections 108.

The functional structure 1400*c* may include a plurality of first sections 106 of the functional region 104*r*, e.g., disposed between at least one second section 108 of the functional region 104*r* and the clamping region 1002. The first sections 106 of the functional region 104*r* may each be formed as a stripe structure, with the stripe structures differing in their width from each other. Alternatively, at least two stripe structures may have an equal width.

The functional structure 1400*d* may include at least one first section 106 having a triangle shape. For example, an edge of the triangle shape may be proximate the clamping region 1002, e.g., in physical contact with the clamping region 1002. The at least one first section 106 having a triangle shape may be disposed between two second sections 108 (e.g., each having a triangle shape) of the functional region 104*r*. In other words, an extension of the at least one first section 106 having the triangle shape may decrease with distance to the clamping region 1002.

Figure 15A:
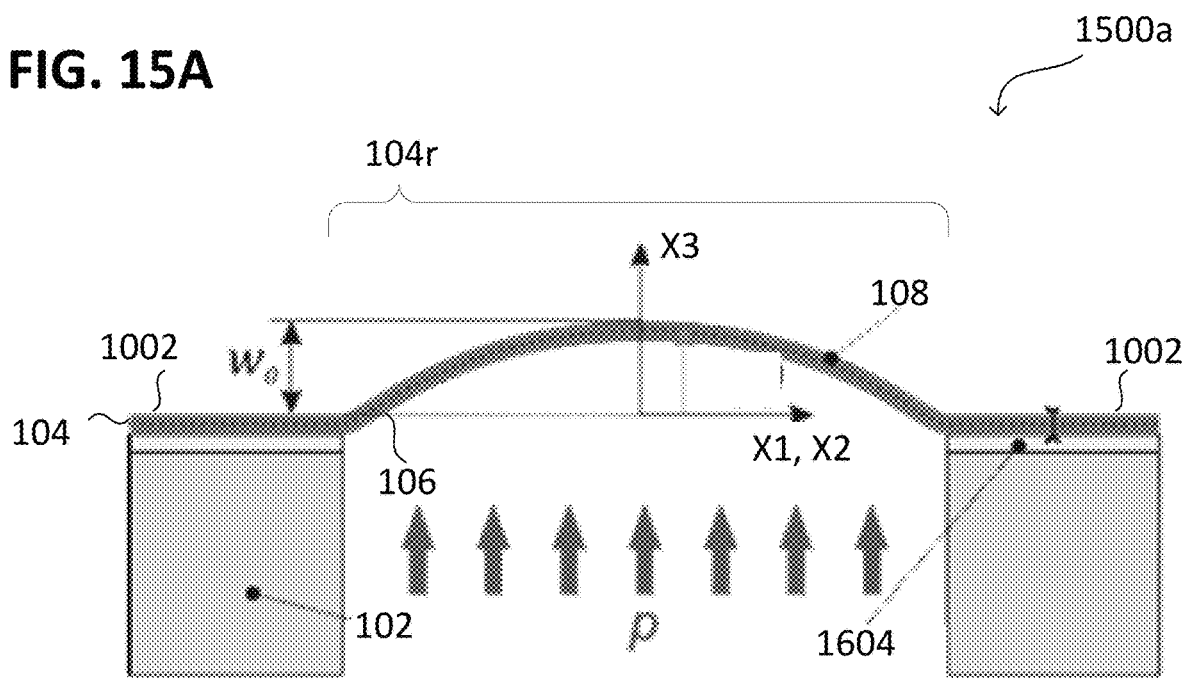
FIGS. 15A and 15B show each a schematic cross-sectional view of a possible implementation of a method according to various embodiments.
Figure 15B:
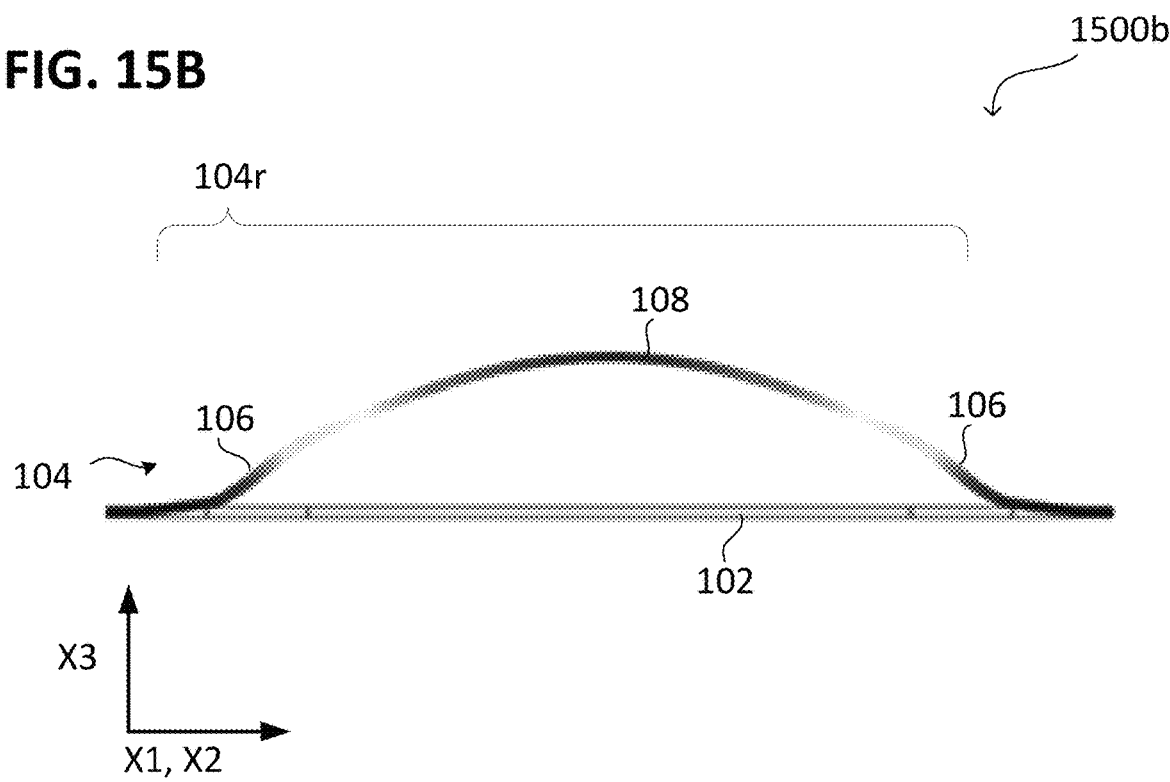

FIG. 15A and FIG. 15B show each a micromechanical structure according to various embodiments, in a cross-sectional view (e.g., a cross section perpendicular to a functional plane X1, X2, e.g., parallel to a plane X1, X3 or a plane X2, X3).

The micromechanical structure 1500*a* may include a functional region 104*r* (configured as diaphragm) which is deflectable with respect to the substrate responsive to a force acting on the functional region 104*r*. In other words, the functional region 104*r* may be configured to be actuated in response to the force.

The force may include a mechanical force, e.g., induced by a mechanical interaction such as a pressure gradient p, e.g., a mechanical wave (including acoustic waves or sound waves), pressure, such as gauge pressure. The mechanical force may be provided externally from the micromechanical structure, i.e., the mechanical force may not originate from the micromechanical structure. An electrically-conductive component, e.g., an electrode or a sensor, may provide an electrical signal in response to the actuation of the functional region 104*r*. The electrical signal may represent the force on the functional region 104*r*, e.g., the actuation of the functional region 104*r* (e.g., the electrical signal may be proportional to the force).

Alternatively or additionally, the force may include an electromagnetic force, e.g., induced by an electromagnetic field (electric field interaction). The electromagnetic field may be generated by an electrical signal transmitted to the micromechanical structure 1500*a*. For example, the electromagnetic force may include or be formed from a Coulomb force or an electrostatic force, or may be a magnetic field interaction, e.g., magnetic force, such as Lorentz force, etc.

According to various embodiments, the functional region 104*r* may include a lateral gradient in at least one of: its elastic modulus, hardness, stiffness, impurity concentration (e.g., atomic ratio of the impurities) and density. The gradient may alter the mechanical properties of the functional region 104*r* locally. Therefore, a deflection characteristic $w_0$ (or respective bending characteristic) may be different between the at least a section 106 and the at least another section 108, as exemplarily illustrated for micromechanical structure 1500*b*.

Figure 16A:
FIG. 16A to 16C show each a schematic cross-sectional view of a possible implementation of a functional structure according to various embodiments.
Figure 16B:
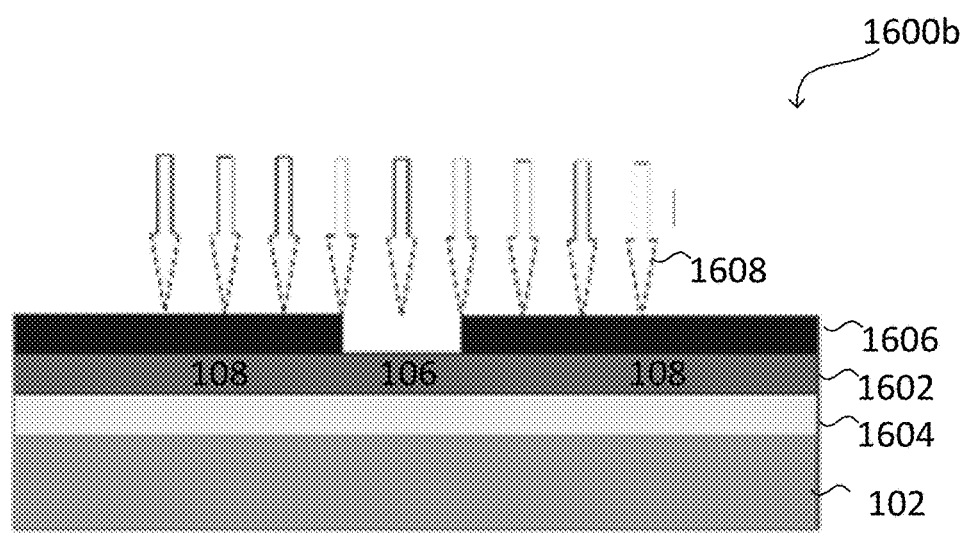
Figure 16C:
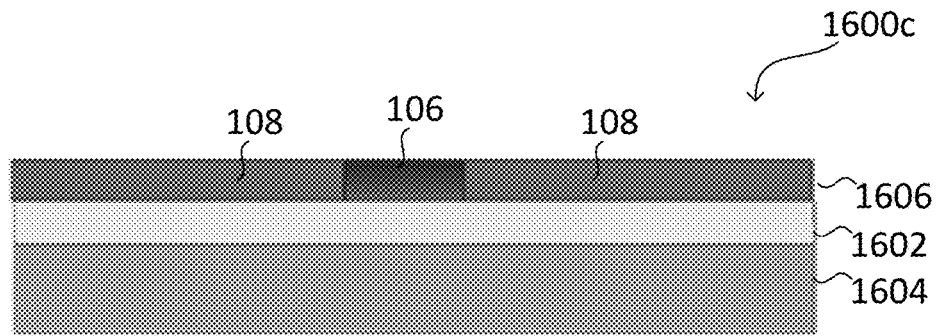

FIG. 16A, FIG. 16B and FIG. 16C show each a method according to various embodiments, in a cross-sectional view (e.g., a cross section perpendicular to a functional plane X1, X2, e.g., parallel to a plane X1, X3 or a plane X2, X3).

The method may include in 1600*a*: forming a layer 1602 (also referred to as functional layer 1602) over the substrate 102. Optionally, the method may include in 1600*a* forming a dielectric layer 1604 between the substrate 102 and the layer 1602. The layer 1602 may include or be formed from a base material, e.g., an amorphous semiconductor material (e.g., a-SiC:H) or an epitaxial semiconductor material. An electrical conductivity of the dielectric layer 1604 may be less than an electrical conductivity of at least one of the layer 1602 and the substrate 102.

The method may further include in 1600*b*: forming a mask 1606 over the layer 1602. The mask 1606 may include at least one opening exposing the layer 1602, e.g., in the at least a section 106 (e.g., one opening per first section 106). The method may further include in 1600*b*: implanting 1608 impurities using the mask 1606, into the layer 1602, e.g., into the at least a section 106. Illustratively, the mask may prevent impurities to be introduced into at least another section 108 of the layer 1602.

By way of example, implanting impurities into the base material may include or be achieved by an ion implantation process. For example, the ion implantation process may include implanting impurity ions (e.g., of at least one of carbon, oxygen and/or nitrogen) into the layer 1602.

The method may further include in 1600*c*: removing the mask 1606. The stack 1604, 1606 may be processed further, e.g., by exposing the layer 1602 on opposite sides, as described herein, to form a functional region 104*r* including or formed from the layer 1602.

Figure 17A:
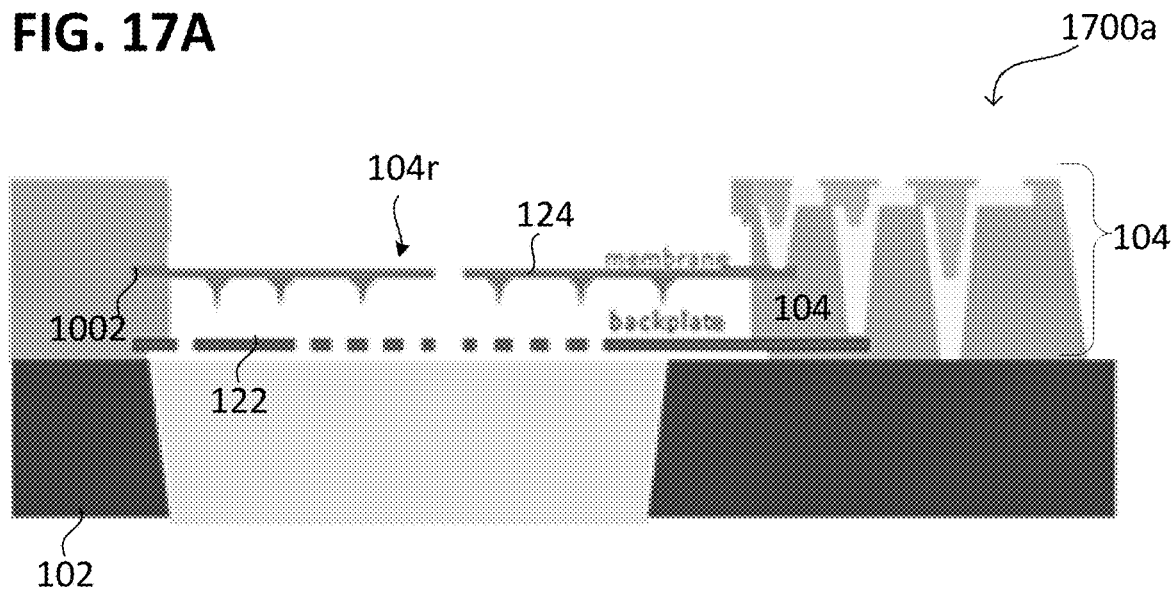
FIG. 17A to 17C show each a method according to various embodiments, in a schematic cross-sectional view illustrating a possible implementation of a functional structure in a micromechanical structure.
Figure 17B:
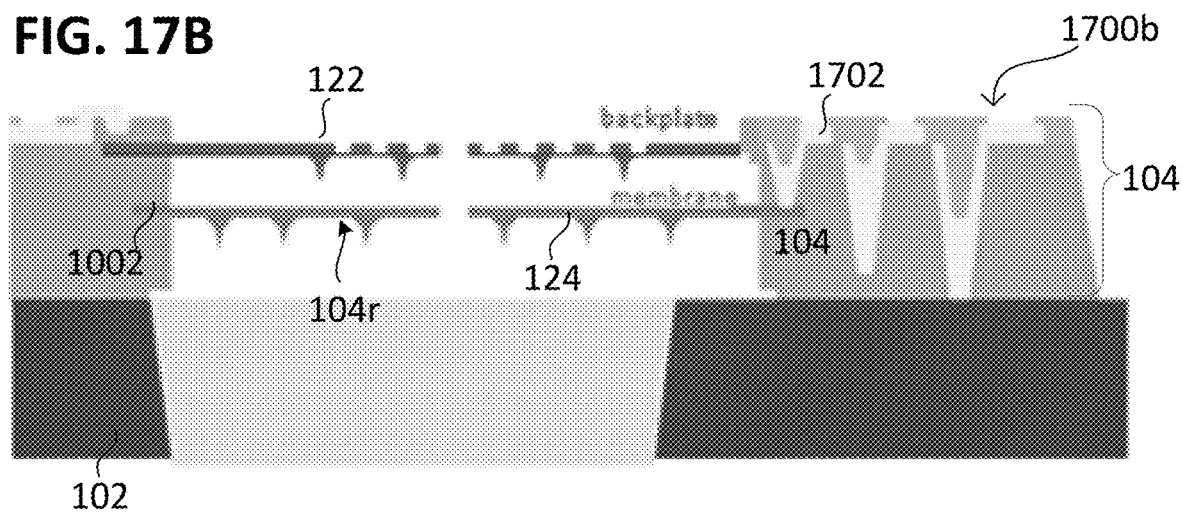
Figure 17C:
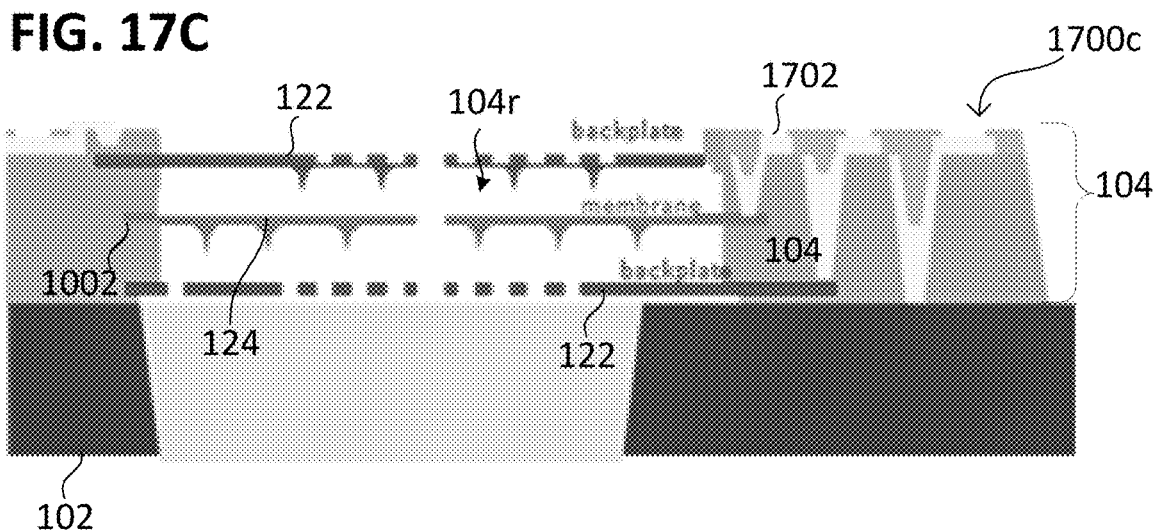
Figure 18A:
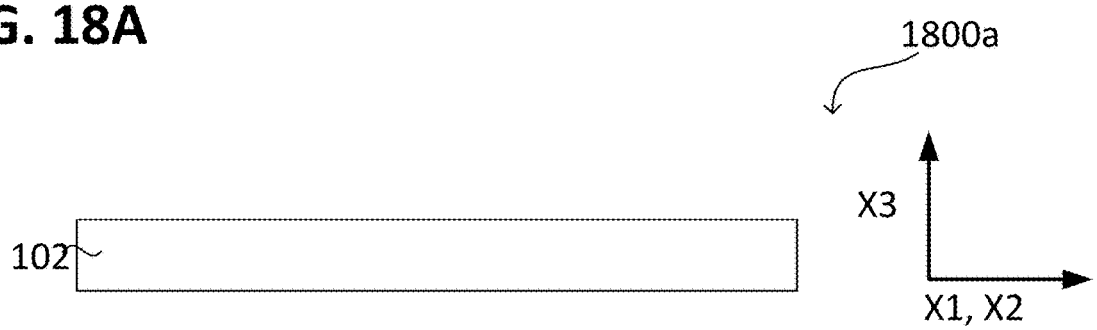
FIG. 18A to 18D show each a method according to various embodiments, in a schematic cross-sectional view illustrating a possible implementation of a functional structure in a micromechanical structure.
Figure 18B:
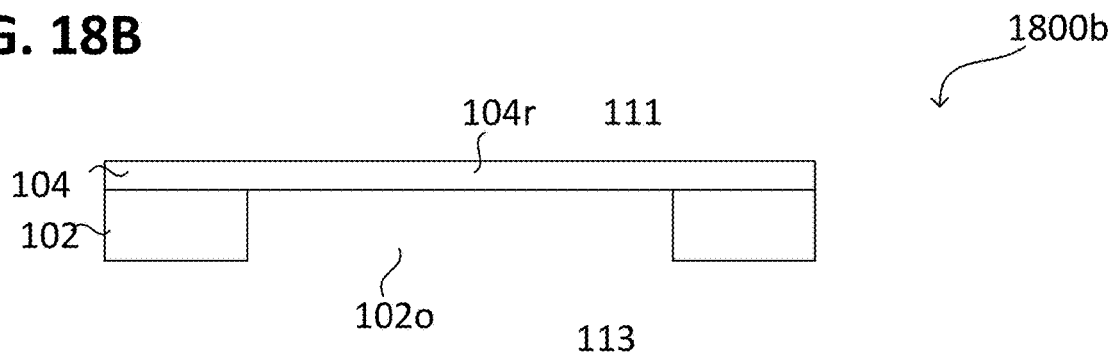
Figure 18C:
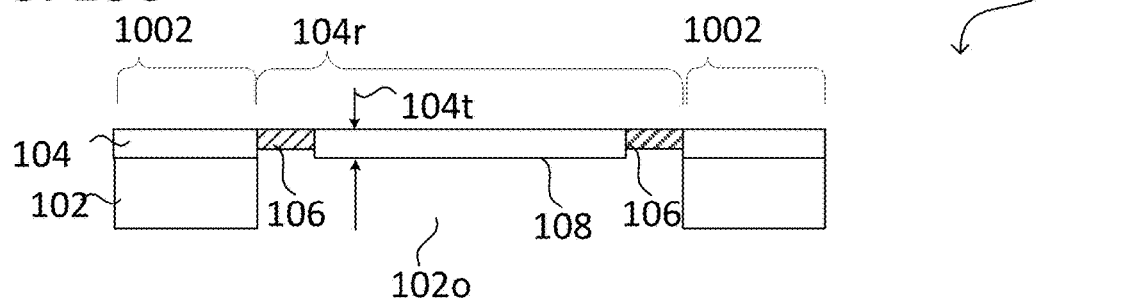
Figure 18D:
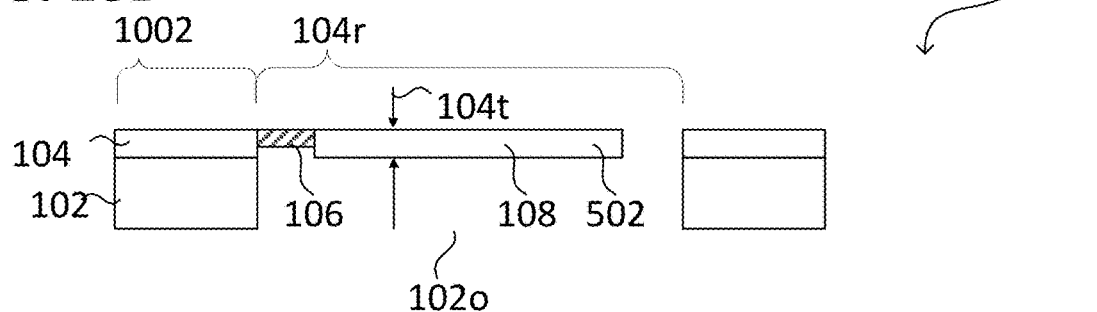

FIG. 17A, FIG. 17B and FIG. 17C show each a micromechanical structure 1700*a*, 1700*b*, 1700*c* according to various embodiments, in a cross-sectional view (e.g., a cross section perpendicular to a functional plane X1, X2).

According to various embodiments, the micromechanical structure (e.g., configured as capacitive microphone) may include a membrane 124 and at least one backplate 122 (e.g., one or two backplates 122) separated by a gap from each other, e.g. an air-gap. The membrane 124 and the at least one backplate 122 may be coupled (e.g. in physical contact) with the substrate 102 or the at least one clamp region 1002. Optionally, the membrane 124 may have a tensile stress, illustratively, to counterbalance the attractive electrostatic force between membrane 124 and the at least one backplate 122 during operation. To reach high sensitivity and high SNR (signal to noise ratios) the membrane 124 may be configured to provide an electrical signal with a high amplitude. Therefore, the deflection of the membrane 124 may be increased by forming the at least a section 106 in the membrane 124, illustratively, by providing a "soft" section 106 (not shown in FIGS. 17A-17C, see, e.g., FIG. 15B).

By applying a force (e.g., inducted by an electrical signal generating the force or inducted by a pressure gradient generating the force) onto the membrane 124, the balancing of the membrane 124 and the at least one backplate 122 may change inducing deflection of the membrane 124.

The micromechanical structure 1700*a*, 1700*b*, 1700*c* may include an electrical contact pad 1702 for electrically contacting, e.g., electrically contacting at least one of the membrane 124 and the at least one backplate 122. Via the electrical contact pad 1702 an electrical signal generated by the micromechanical structure 1700*a*, 1700*b*, 1700*c* may be readout. Alternatively or additionally, the micromechanical structure 1700*a*, 1700*b*, 1700*c* may be driven by an electrical signal supplied to the electrical contact pad 1702. Illustratively, the membrane 124 and the at least one backplate 122 may form a capacitive element having a capacitive impedance. The backplate 122 may provide an electrode of the micromechanical structure.

FIG. 18A, FIG. 18B, FIG. 18C and FIG. 18D show each a method according to various embodiments, in a schematic cross-sectional view (e.g., a cross section perpendicular to a functional plane X1, X2).

The method may include in 1800*a*: providing a substrate 102 (e.g., configured as described before).

The method may further include in 1800*b* and 1800*c*: arranging a functional structure 104 at (e.g., in or over) the substrate 102. The functional structure 104 may include or be formed from a functional layer. The functional structure 104 may include or be formed from a functional region 104*r* which is deflectable with respect to the substrate responsive to a force acting on the functional region.

At least a first section 106 of the functional region 104*r* may have a smaller thickness 104*t* (extension perpendicular to the functional plane X1, X2) compared to at least a second section 108 of the functional region 104*r*, for example, less than about 90% (e.g., less than about 75%, about 50%, about 25%, about 10% or less than about 5%) of the thickness of the second section 108. This may enable that at least one of an elastic modulus and a mechanical hardness of the functional region 104*r* is lower in the at least a first section 106 than in the at least a second section 108.

By way of example, the method may further include in 1800*b* and 1800*c* thinning the functional region 104*r* in the at least a first section 106, e.g., by etching, milling (e.g., ion milling, e.g., reactive ion milling) also referred to as other subtractive manufacturing methods.

In one or more embodiments, the functional structure 104 may include a membrane, as illustrated in 1800*c*, or a cantilever beam, as illustrated in 1800*d*.

In one or more embodiments, the at least a first section 106 may be at a suspension or clamping point or area (interface of the functional region 104*r* and the suspension region 1002) of the membrane or cantilever beam. In other words, the at least a first section 106 may be in physical contact with at least one of the substrate 102 and the suspension region 1002 in its clamping point or area.

Optionally, the at least one first section 106 of the functional region 104*r* may include impurities, for example, in a higher concentration than the at least one second section 108 of the functional region 104*r*. Alternatively, the at least one first section 106 of the functional region 104*r* and the at least one second section 108 of the functional region 104*r* may include or be formed from the same base material, e.g., in a homogeneous material composition (e.g., spatially extended over the functional region 104*r*). A homogeneous material composition may have a maximum deviation from the respective spatially averaged material composition, e.g., in a concentration of the respective material constituents, of less than about 10%, e.g., less than about 5%, e.g., less than about 1%, e.g., less than about 0.1%.

The micromechanical structure may further be configured in accordance with one or more embodiments described herein.

Further, various embodiments will be described in the following.

According to various embodiments, a micromechanical structure may include: a substrate; and a functional structure arranged at (e.g., in physical contact with) the substrate; wherein the functional structure may include or be formed from a functional region which is deflectable with respect to the substrate responsive to a force acting on the functional region; and wherein at least a section of the functional region may have an elastic modulus in the range from about 5 GPa to about 70 GPa.

According to various embodiments, the elastic modulus may be in the range from about 10 GPa to about 60 GPa.

According to various embodiments, the at least a section may include or be formed from a material having a density in the range from about 1 g/cm$^3$ (grams per cubic centimeter) to about 16 g/cm$^3$ (e.g., if the material includes or is formed from a metal-carbon compound like tungsten carbide), e.g., in the range from about 1 g/cm$^3$ to about 4 g/cm$^3$ (e.g., if the material includes or is formed from silicon).

According to various embodiments, the at least a section may include or be formed from a material having a coefficient of thermal expansion (CTE) in the range from about $1 \cdot 10^{-6}$/Kelvin to about $6 \cdot 10^{-6}$/Kelvin, for example, about $3 \cdot 10^{-6}$/Kelvin (e.g., if the at least a section includes or is formed from silicon). The CTE may be understood as linear CTE measured at standard conditions for temperature and pressure, e.g., at standard temperature of about 273.15 Kelvin.

According to various embodiments, the at least a section may include or be formed from a compound material including or formed from at least two elements (chemical elements).

According to various embodiments, the at least a section may include or be formed from amorphous hydrogenated silicon carbide (a-SiC:H).

According to various embodiments, the a-SiC:H may have a carbon content (e.g., mole fraction) in the range from about 1 at.-% to about 99 at.-% (atomic percent), e.g. about 50 at.-%.

According to various embodiments, the a-SiC:H may have a hydrogen content (e.g., mole fraction) in the range from about 1 at.-% to about 66 at.-%, e.g. about 33 at.-%.

According to various embodiments, the at least a section may include or be formed from amorphous hydrogenated carbon (a-C:H). The amorphous hydrogenated carbon may include inorganic components (e.g., carbon dominated) and organic components (e.g., carbon-hydrogen joints). The amorphous hydrogenated carbon may include carbon an amorphous carbon configuration, wherein hydrogen may be incorporated in the amorphous carbon configuration (having a sp$^3$-hybridized carbon content and a sp$^2$-hybridized carbon content).

According to various embodiments, the at least a section may include or be formed from a base material that is doped with impurities. The impurities may differ from the base material.

According to various embodiments, the base material may include at least one of a metalloid (such as Si, Ge, As, Sb, and Te) or a polyatomic nonmetal (such as C, P, and Se).

According to various embodiments, the base material may include metal, e.g., a post-transition metal (such as aluminum).

According to various embodiments, the impurities may include or be formed from at least one of: phosphorous, carbon, nitrogen, oxygen, boron, fluorine, gallium, germanium, and/or arsenic.

According to various embodiments, the functional structure may include or be formed from a membrane (also referred to as diaphragm).

According to various embodiments, the functional structure may include or be formed from a cantilever beam.

According to various embodiments, only a section of the functional region may have an elastic modulus in the range from about 5 GPa to about 70 GPa.

According to various embodiments, the functional structure may include or be formed from a membrane or a cantilever beam, and wherein the at least a section may include or be formed from a suspension or clamping point or area of the membrane or cantilever beam.

According to various embodiments, a sound transducer may include or be formed from a micromechanical structure as described herein.

According to various embodiments, the sound transducer may be configured as a microphone.

According to various embodiments, the sound transducer may be configured as a loudspeaker.

According to various embodiments, a sensor may include or be formed from a micromechanical structure as described herein.

According to various embodiments, the sensor may be configured as a pressure sensor.

According to various embodiments, the sensor may be configured as an atomic force microscopy (AFM) sensor.

According to various embodiments, a micromechanical structure may include: a substrate; and a functional structure arranged at (e.g., in physical contact with) the substrate; wherein the functional structure may include or be formed from a functional region which is deflectable with respect to the substrate responsive to a force acting on the functional region; wherein the functional region may include or be formed from a base material; and wherein in at least a section of the functional region the base material includes (e.g., is doped) with impurities such that at least one of an elastic modulus and a mechanical hardness is lower in said at least a section compared to an elastic modulus and a mechanical hardness in another section of the functional region that is not (or less) doped with the impurities. In other words, the functional region may include a gradient in the impurity concentration.

According to various embodiments, the elastic modulus in said at least a section of the functional region where the base material includes the impurities or is doped is in the range from about 10 GPa to about 60 GPa.

According to various embodiments, the base material may include or be formed from at least one of: amorphous hydrogenated silicon carbide (a-SiC:H), amorphous hydrogenated carbon (a-C:H), amorphous hydrogenated silicon nitride (a-SiN:H), amorphous hydrogenated silicon carbooxide (a-SiCO:H).

According to various embodiments, the impurities may include or be formed from at least one of: phosphorous, carbon, nitrogen, oxygen, boron, fluorine, gallium, germanium, and/or arsenic.

According to various embodiments, the functional structure may include or be formed from a membrane or a cantilever beam, wherein the at least a section where the base material is doped with impurities may include or be formed from a suspension or clamping point or area of the membrane or cantilever beam.

According to various embodiments, a sound transducer may include or be formed from a micromechanical structure as described herein.

According to various embodiments, the sound transducer may be configured as a microphone.

According to various embodiments, the sound transducer may be configured as a loudspeaker.

According to various embodiments, a sensor may include or be formed from a micromechanical structure as described herein.

According to various embodiments, the sensor may be configured as a pressure sensor.

According to various embodiments, the sensor may be configured as an atomic force microscopy (AFM) sensor.

According to various embodiments, a micromechanical structure may include: a substrate; and a functional structure arranged at (e.g., in physical contact with) the substrate; wherein the functional structure may include or be formed from a functional region which is deflectable with respect to the substrate responsive to a force acting on the functional region; and wherein at least a section of the functional region may include or be formed from an amorphous hydrogenated silicon carbide (a-SiC:H) material.

According to various embodiments, the elastic modulus in said at least a section of the functional region where the base material is doped may be in the range from about 10 GPa to about 60 GPa.

According to various embodiments, the a-SiC:H material may be doped with impurities.

According to various embodiments, the impurities may include or be formed from at least one of the following materials: phosphorous, carbon, nitrogen, oxygen, boron, fluorine, gallium, germanium, arsenic.

According to various embodiments, a method for fabricating a micromechanical structure may include: providing a substrate; and arranging a functional structure at the substrate; wherein the functional structure may include or be formed from a functional region which is deflectable with respect to the substrate responsive to a force acting on the functional region; and wherein at least a section of the functional region may have an elastic modulus in the range from about 5 GPa to about 70 GPa.

According to various embodiments, a method for fabricating a micromechanical structure may include: providing a substrate; arranging a functional structure at the substrate, wherein the functional structure may include or be formed from a functional region including or formed from a base material, and wherein the functional region may be deflectable with respect to the substrate responsive to a force acting on the functional region; and introducing impurities into the base material in at least a section of the functional region so as to reduce at least one of an elastic modulus and a mechanical hardness of the functional region in the at least a section of the functional region.

According to various embodiments, arranging the functional structure at the substrate may include depositing at least one layer at the substrate.

According to various embodiments, depositing at least one layer at the substrate may include a vapor deposition process.

According to various embodiments, the vapor deposition process may include a chemical vapor deposition (CVD) process.

According to various embodiments, the chemical vapor deposition process may include a plasma enhanced chemical vapor deposition (PECVD) process.

According to various embodiments, the vapor deposition process may include a physical vapor deposition (PVD) process.

According to various embodiments, the physical vapor deposition process may include a sputter process.

According to various embodiments, introducing impurities into the base material may be carried out after arranging the functional structure at the substrate.

According to various embodiments, introducing impurities into the base material may be carried out before arranging the functional structure at the substrate.

According to various embodiments, introducing impurities into the base material may include or be formed from introducing impurities into the base material in only the at least a section of the functional region.

According to various embodiments, introducing impurities into the base material may be configured such that the at least a section of the functional region and another section of the functional region differ in at least one of: a thickness, a chemical composition, an impurity concentration, a stiffness, a mechanical hardness and/or an elastic modulus.

According to various embodiments, introducing impurities into the base material may include or be formed from introducing impurities into the base material in the entire functional region.

According to various embodiments, introducing impurities into the base material may include or be formed from doping the base material with impurities.

According to various embodiments, doping the base material with impurities may include or be formed from implanting impurities into the base material.

According to various embodiments, implanting impurities into the base material may include or be formed from an ion implantation process.

According to various embodiments, the base material may include or be formed from at least one of the following materials: polysilicon, amorphous hydrogenated silicon carbide (a-SiC:H), amorphous hydrogenated carbon (a-C:H), amorphous hydrogenated silicon nitride (a-SiN:H), amorphous hydrogenated silicon carbooxide (a-SiCO:H), aluminum, gallium, germanium, indium, arsenic, antimony, cadmium, tellurium, selenium, zinc, or combinations thereof with at least one of silicon, carbon, nitrogen, oxygen, hydrogen.

According to various embodiments, the impurities may include or be formed from at least one of the following materials: phosphorus, carbon, nitrogen, oxygen, boron, fluorine, gallium, germanium, arsenic.

According to various embodiments, the method may further include annealing the base material having the introduced impurities.

According to various embodiments, an annealing temperature may be greater than or equal to about 600° C.

According to various embodiments, an annealing temperature may be in the range from about 300° C. (degree Celsius) to about 2000° C. For example, the annealing may be inhomogeneous, e.g., configured to achieve a higher annealing temperature in the at least a section (e.g., in the base material) of the functional region than in the another section of the functional region. The annealing temperature may be understood as measured at standard conditions.

According to various embodiments, the annealing temperature may be more than a melting point of the base material, e.g., greater than a melting point of silicon (about 1414° C.).

According to various embodiments, the annealing may include heating ( ) the base material by a furnace (in other words, by a transfer of thermal energy via thermal radiation).

According to various embodiments, the annealing may include irradiating the base material by a stimulated emission of electromagnetic radiation (e.g., by a laser light source, also referred to as laser). For example, the annealing may include or be formed from laser annealing, e.g., pulsed laser annealing.

According to various embodiments, the annealing may include irradiating the base material by pulsed electromagnetic radiation (e.g., generated by a laser light source), e.g., by a pulsed laser beam.

According to various embodiments, the annealing may include or be formed from irradiating the base material in accordance with a predetermined pattern, e.g., only a fraction of the base material. Illustratively, the base material may be annealed locally (e.g., in one or more regions forming the pattern), e.g., by scanning the base material with a laser beam according to the predetermined pattern (or according to a corresponding scanning path). For example, the laser may be used to write the pattern into the doped material (illustratively, to modify the mechanical properties in the irradiated region(s)).

According to various embodiments, the annealing may be in the range from about 300° C. to about 2000° C.

According to various embodiments, a method for fabricating a micromechanical structure may include: providing a substrate; and arranging a functional structure at the substrate; wherein the functional structure may include or be formed from a functional region which is deflectable with respect to the substrate responsive to a force acting on the functional region; and wherein at least a section of the functional region may include or be formed from an amorphous hydrogenated silicon carbide (a-SiC:H) material.

A micromechanical structure in accordance with various embodiments may include: a substrate; and a functional structure arranged at (e.g., in physical contact with) the substrate; wherein the functional structure includes a functional region which is deflectable with respect to the substrate responsive to a force acting on the functional region; and wherein at least a section of the functional region includes a material having an elastic modulus in the range from about 5 GPa to about 70 GPa.

A micromechanical structure in accordance with various embodiments may include: a substrate; and a functional structure arranged at (e.g., in physical contact with) the substrate; wherein at least a section of the functional structure is deflectable with respect to the substrate responsive to a force acting on the functional structure; and wherein at least a section of the functional structure includes a material having an elastic modulus in the range from about 5 GPa to about 70 GPa.

A micromechanical structure in accordance with various embodiments may include: a substrate; and a functional structure arranged at (e.g., in physical contact with) the substrate; wherein the functional structure includes a functional region which is deflectable with respect to the substrate responsive to a force acting on the functional region; wherein the functional region may include or be formed from a base material; and wherein in at least a first section of the functional region the base material is doped with impurities, such that the at least a first section of the functional region has at least one of a lower elastic modulus and a lower mechanical hardness than at least a second section of the functional region adjacent to the at least a first section of the functional region.

A micromechanical structure in accordance with various embodiments may include: a substrate; and a functional structure arranged at (e.g., in physical contact with) the substrate; wherein the functional structure includes a functional region which is deflectable with respect to the substrate responsive to a force acting on the functional region; wherein the functional region includes a base material; and wherein in at least a first section (also referred to as weakening section) of the functional region the base material is doped with impurities, such that the doped base material in the at least a first section (weakening section) of the functional region has at least one of a lower elastic modulus and a lower mechanical hardness than the undoped or less doped base material in at least a second section of the functional region adjacent to the at least a first section (weakening section) of the functional region.

A micromechanical structure in accordance with various embodiments may include: a substrate; and a functional structure arranged at (e.g., in physical contact with) the substrate, wherein the functional structure includes a functional region which is deflectable with respect to the substrate responsive to a force acting on the functional region; and wherein at least a section (e.g., the at least a first section) of the functional region has an elastic modulus in the range from about 5 GPa to about 70 GPa.

A micromechanical structure in accordance with various embodiments may include: a substrate; and a functional structure arranged at (e.g., in physical contact with) the substrate; wherein the functional structure includes a functional region which is deflectable with respect to the substrate responsive to a force acting on the functional region; wherein the functional region includes a base material; and wherein in at least a section of the functional region the base material is doped with impurities such that at least one of an elastic modulus and a mechanical hardness is lower in said at least a section compared to an elastic modulus and a mechanical hardness in another section of the functional region that is not doped with the impurities or less than said at least a section.

A micromechanical structure in accordance with various embodiments may include: a substrate; and a functional structure arranged at (e.g., in physical contact with) the substrate; wherein the functional structure includes a functional region which is deflectable with respect to the substrate responsive to a force acting on the functional region; and wherein at least a section of the functional region includes an amorphous hydrogenated silicon carbide (a-SiC:H) material.

A micromechanical structure in accordance with various embodiments may include: a substrate; and a functional layer arranged at (e.g., in physical contact with) the substrate; wherein the functional layer includes a functional region which is deflectable with respect to the substrate responsive to a force acting on the functional region; and wherein at least a first section of the functional region has a smaller thickness compared to at least a second section of the functional region, such that at least one of an elastic modulus and a mechanical hardness of the functional region is lower in the at least a first section than in the at least a second section. In one or more embodiments, the functional layer may include a membrane or a cantilever beam. In one or more embodiments, the at least a first section may be at a suspension or clamping point or area of the membrane or cantilever beam. The micromechanical structure may further be configured in accordance with one or more embodiments described herein.

A micromechanical structure in accordance with various embodiments may include: a substrate; and a functional layer arranged at (e.g., in physical contact with) the substrate; wherein the functional layer includes a functional region which is deflectable with respect to the substrate responsive to a force acting on the functional region; wherein the functional layer has a homogeneous material composition; and wherein at least a first section of the functional region has a smaller thickness compared to at least a second section of the functional region, such that at least one of an elastic modulus and a mechanical hardness of the functional region is lower in the at least a first section than in the at least a second section. In one or more embodiments, the functional layer may include a membrane or a cantilever beam. In one or more embodiments, the at least a first section may be at (e.g., in physical contact with) a suspension or clamping point or area of the membrane or cantilever beam. The micromechanical structure may further be configured in accordance with one or more embodiments described herein.

A micromechanical structure in accordance with various embodiments may include: a substrate; and a functional structure arranged at (e.g., in physical contact with) the substrate; wherein the functional structure is made of a single layer and/or has a homogeneous material composition; wherein the functional structure includes a functional region which is deflectable with respect to the substrate responsive to a force acting on the functional region; and wherein at least a first section of the functional region has a smaller thickness compared to at least a second section of the functional region, such that at least one of an elastic modulus and a mechanical hardness of the functional region is lower in the at least a first section than in the at least a second section. In one or more embodiments, the functional structure may include a membrane or a cantilever beam. In one or more embodiments, the at least a first section may be at a suspension or clamping point or area of the membrane or cantilever beam. The micromechanical structure may further be configured in accordance with one or more embodiments described herein.

A method for fabricating a micromechanical structure in accordance with various embodiments may include: providing a substrate; and arranging a functional structure at the substrate; wherein the functional structure includes a functional region which is deflectable with respect to the substrate responsive to a force acting on the functional region; and wherein at least a section of the functional region has an elastic modulus in the range from about 5 GPa to about 70 GPa.

A method for fabricating a micromechanical structure in accordance with various embodiments may include: arranging a functional structure at the substrate, wherein the functional structure includes a functional region including a base material, and wherein the functional region is deflectable with respect to the substrate responsive to a force acting on the functional region; and introducing impurities into the base material in at least a section of the functional region so as to reduce at least one of an elastic modulus and a mechanical hardness of the functional region in the at least a section of the functional region.

A method for fabricating a micromechanical structure in accordance with various embodiments may include: providing a substrate; and arranging a functional structure at the substrate; wherein the functional structure includes a functional region which is deflectable with respect to the substrate responsive to a force acting on the functional region; and wherein at least a section of the functional region includes an amorphous hydrogenated silicon carbide (a-SiC:H) material.

A method for fabricating a micromechanical structure in accordance with various embodiments may include: providing a substrate; and arranging a functional layer at the substrate; wherein the functional layer includes a functional region which is deflectable with respect to the substrate responsive to a force acting on the functional region; and wherein at least a first section of the functional region has a smaller thickness compared to at least a second section of the functional region, such that at least one of an elastic modulus and a mechanical hardness of the functional region is lower in the at least a first section than in the at least a second section. In one or more embodiments, the functional layer may include a membrane or a cantilever beam. In one or more embodiments, the at least a first section may be at a suspension or clamping point or area of the membrane or cantilever beam. The micromechanical structure may further be configured in accordance with one or more embodiments described herein.

A method for fabricating a micromechanical structure in accordance with various embodiments may include: providing a substrate; and arranging a functional layer at the substrate; wherein the functional layer includes a functional region which is deflectable with respect to the substrate responsive to a force acting on the functional region; wherein the functional layer has a homogeneous material composition; and wherein at least a first section of the functional region has a smaller thickness compared to at least a second section of the functional region, such that at least one of an elastic modulus and a mechanical hardness of the functional region is lower in the at least a first section than in the at least a second section. In one or more embodiments, the functional layer may include a membrane or a cantilever beam. In one or more embodiments, the at least a first section may be at a suspension or clamping point or area of the membrane or cantilever beam. The micromechanical structure may further be configured in accordance with one or more embodiments described herein.

A method for fabricating a micromechanical structure in accordance with various embodiments may include: arranging a functional structure including a base material at a substrate such that the functional structure is deflectable in a functional region with respect to the substrate responsive to a force acting on the functional region; and doping the base material of the functional structure with impurities in at least a section of the functional region so as to reduce at least one of an elastic modulus and a mechanical hardness of the base material in the at least a section of the functional region.

A method for fabricating a micromechanical structure in accordance with various embodiments may include: arranging a functional structure at a substrate such that a functional region of the functional structure is deflectable with respect to the substrate responsive to a force acting on the functional region; and introducing impurities into at least a first section of the functional region so as to reduce at least one of an elastic modulus and a mechanical hardness of the functional structure in the at least a first section of the functional region compared to an elastic modulus or mechanical hardness of the functional structure in at least a second section of the functional region adjacent to the at least a first section of the functional region.

According to various embodiments, the at least one of the functional structure, the functional region the at least a first section and the at least a second section may include or be formed from an inorganic material. In various embodiments, the base material, the impurities and/or their combination may be inorganic.

According to various embodiments, a functional region may include or be formed from at least one first section and at least one second section differing from each other in at least one of: a thickness, a chemical composition, an impurity concentration, a stiffness, a mechanical hardness and/or an elastic modulus. Alternatively or additionally, the at least one first region and the at least one second region may have the same base material.

According to various embodiments, the functional region (e.g., its at least a section and/or at least another section) may include or be formed from an amorphous base material.

According to various embodiments, the elastic modulus may be understood as tensile stress divided by the external strain. A material, region or section may elongate (tensile stress) in response to the external strain. The tensile stress may refer to as normalized elongation, in other words, elongation per length before applying the external strain. The external strain may refer to as force per area. The area may refer to the cross sectional area of the material, region or section perpendicular to the direction of the tensile stress. The cross sectional area of the region or section, e.g., made from the material, may be defined by the width and height of the region or section or two other respective extensions perpendicular to the direction of the tensile stress. The elastic modulus of a region or section to which the applied force is scaled to the entire cross sectional area of the region or section may coincidence with the elastic modulus of the material from which the region or section is made. The elastic modulus of a region or section may be understood as elastic modulus of the material from which the region or section is substantially made. The elastic modulus may be understood as material parameter and given at standard conditions (273,15 Kelvin).

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A micromechanical structure, comprising:
    a substrate; and
    a functional structure arranged at the substrate;
    wherein the functional structure comprises a first functional region, adjacent to a first portion of the substrate, the first functional region being deflectable with respect to the substrate responsive to a force acting on the functional structure; and a second functional region, wherein the first functional region is between the first portion of the substrate and the second functional region;
    wherein the first functional region comprises a base material;
    wherein the second functional region has at least one of a module of elasticity or a hardness within a range of 5 GPa to 70 GPa;
    wherein in at least one section of the first functional region the base material is doped with impurity atoms, so that at least one of a module of elasticity or a hardness in the at least one section is 75% or less of the module of elasticity or the hardness in the second functional region of the functional structure that is not doped with impurity atoms or is doped less than the at least one section;
    wherein the impurity atoms comprise at least one of phosphorus, carbon, nitrogen, oxygen, boron, fluorine, gallium, germanium, and arsenic; and further comprising at least one backplate, the backplate contacting the substrate and separated by an air-gap from the functional structure;
    wherein the functional structure is actuated in response to an electrical signal transmitted to the backplate.

2. The micromechanical structure of claim 1, wherein the at least one section comprises a material having a density in the range from about 1 g/cm$^3$ to about 16 g/cm$^3$.

3. The micromechanical structure of claim 1, wherein the at least one section comprises a material having a coefficient of thermal expansion (CTE) in the range from about $1 \cdot 10^{-6}$/Kelvin to about $6 \cdot 10^{-6}$/Kelvin.

4. The micromechanical structure of claim 1, wherein the at least one section comprises a compound material comprising at least two elements.

5. The micromechanical structure of claim 1, wherein the at least one section comprises amorphous hydrogenated silicon carbide (a-SiC:H).

6. The micromechanical structure of claim 5, wherein the a-SiC:H has a carbon content in the range from about 1 at.-% to about 99 at.-%.

7. The micromechanical structure of claim 5, wherein the a-SiC:H has a hydrogen content in the range from about 1 at.-% to about 66 at.-%.

8. The micromechanical structure of claim 1, wherein the at least one section comprises amorphous hydrogenated carbon (a-C:H).

9. The micromechanical structure of claim 1, wherein the at least one section comprises a base material that is doped with impurities.

10. The micromechanical structure of claim 1, wherein the functional structure comprises a membrane or a cantilever beam.

11. The micromechanical structure of claim 1, wherein the functional structure comprises a membrane or a cantilever beam, and wherein the at least one section comprises a suspension or clamping point or area of the membrane or cantilever beam.

12. A sound transducer comprising a micromechanical structure, the micromechanical structure comprising:
    a substrate; and
    a functional structure arranged at the substrate;
    wherein the functional structure comprises a first functional region, adjacent to a first portion of the substrate, the first functional region being deflectable with respect to the substrate responsive to a force acting on the functional structure; and a second functional region, wherein the first functional region is between the first portion of the substrate and the second functional region;
    wherein the first functional region comprises a base material;
    wherein the second functional region has at least one of a module of elasticity or a hardness within a range of 5 GPa to 70 GPa;
    wherein in at least one section of the first functional region the base material is doped with impurity atoms, so that at least one of a module of elasticity or a hardness in the at least one section is 75% or less of the module of elasticity or the hardness in the second functional region of the functional structure that is not doped with impurity atoms or is doped less than the at least one section;
    wherein the impurity atoms comprise at least one of phosphorus, carbon, nitrogen, oxygen, boron, fluorine, gallium, germanium, and arsenic; and
    wherein the sound transducer is configured to transduce sound.

13. The sound transducer of claim 12, configured as a microphone.

14. The sound transducer of claim 12, configured as a loudspeaker.

15. The micromechanical structure of claim 12, wherein the at least one section comprises a material having a density in the range from about 1 g/cm$^3$ to about 16 g/cm$^3$.

16. The micromechanical structure of claim 12, wherein the at least one section comprises a material having a coefficient of thermal expansion (CTE) in the range from about $1 \cdot 10^{-6}$/Kelvin to about $6 \cdot 10^{-6}$/Kelvin.

17. The micromechanical structure of claim 12, wherein the at least one section comprises a compound material comprising at least two elements.

18. The micromechanical structure of claim 12, wherein the at least one section comprises amorphous hydrogenated silicon carbide (a-SiC:H).

19. A sensor comprising a micromechanical structure, the micromechanical structure comprising:
    a substrate; and
    a functional structure arranged at the substrate;
    wherein the functional structure comprises a first functional region, adjacent to a first portion of the substrate, the first functional region being deflectable with respect to the substrate responsive to a force acting on the functional structure; and a second functional region, wherein the first functional region is between the first portion of the substrate and the second functional region;
    wherein the first functional region comprises base material;
    wherein the second functional region has at least one of a module of elasticity or a hardness within a range of 5 GPa to 70 GPa;
    wherein in at least one section of the first functional region the base material is doped with impurity atoms, so that at least one of a module of elasticity or a hardness in the at least one section is 75% or less of the module of elasticity or the hardness in the second of the functional region of the functional structure that is not doped with impurity atoms or is doped less than the at least one section;
    wherein the impurity atoms comprise at least one of phosphorus, carbon, nitrogen, oxygen, boron, fluorine, gallium, germanium, and arsenic;
    wherein the sensor is configured to provide an electrical signal in response to the actuation of the functional region;
    further comprising at least one backplate, the backplate contacting the substrate and separated by an air-gap from the functional structure; and
    wherein the functional structure is actuated in response to an electrical signal transmitted to the backplate.

20. The sensor of claim 19, configured as a pressure sensor.

21. The sensor of claim 19, configured as an atomic force microscopy (AFM) sensor.

* * * * *